US00RE38279E

(19) United States
(12) Reissued Patent
Kataoka et al.

(10) Patent Number: US RE38,279 E
(45) Date of Reissued Patent: Oct. 21, 2003

(54) VECTOR CODING METHOD, ENCODER USING THE SAME AND DECODER THEREFOR

(75) Inventors: Akitoshi Kataoka, Tokyo (JP); Jotaro Ikedo, Hachioji (JP)

(73) Assignee: Nippon Telegraph and Telephone Corp., Tokyo (JP)

(21) Appl. No.: 09/691,862

(22) PCT Filed: Sep. 29, 1995

(86) PCT No.: PCT/JP95/01989

§ 371 (c)(1),
(2), (4) Date: Apr. 23, 1997

(87) PCT Pub. No.: WO96/11468

PCT Pub. Date: Apr. 18, 1996

Related U.S. Patent Documents

Reissue of:
(64) Patent No.: 5,825,311
Issued: Oct. 20, 1998
Appl. No.: 08/793,133
Filed: Apr. 23, 1997

(30) Foreign Application Priority Data

Oct. 7, 1994 (JP) ..... 6-244128

(51) Int. Cl.[7] ..... G01G 9/18; H03M 7/30
(52) U.S. Cl. ..... 341/51; 704/222
(58) Field of Search ..... 341/51; 704/222, 704/50, 107

(56) References Cited

U.S. PATENT DOCUMENTS 5,086,471 A * 2/1992 Tanaka et al. ..... 381/36
5,274,741 A * 12/1993 Taniguchi et al. ..... 704/222
5,396,576 A * 3/1995 Miki et al. ..... 704/222
5,677,986 A * 10/1997 Amada et al. ..... 704/222
5,687,284 A * 11/1997 Serizawa et al. ..... 704/222

OTHER PUBLICATIONS

International Telecommunication Union (ITU–T), General Aspects of Digital Transmission Systems, Coding of Speech at 8 kbit/s Using Conjugate–Structure Algebraic–Code–Excited Linear–Prediction (CS–ACELP), ITU–T Recommendation G.729, 1996 pp. 1–35.

* cited by examiner

*Primary Examiner*—Peguy JeanPierre
(74) *Attorney, Agent, or Firm*—Oblon, Spivak, McClelland, Maier & Neustadt, P.C.

(57) ABSTRACT

Representative vectors $Z_{1i}$ and $Z_{2j}$ are selected from [codebooks] *codebooks* CB1 and [CB1] *CB2*, respectively, and multiplied by weighting coefficient vectors $w_1$ and $w_2$ of the same number of dimensions as those of the representative vectors, whereby weighted representative vectors $Z_{1i}w_1$ and $Z_{2j}w_2$ are generated. These weighted representative vectors are vector combined into a combined vector $y_{ij}$, and a combination of the representative vectors is selected by a control part in such a manner as to minimize the distance between the combined vector $y_{ij}$ and an input vector X. The weighting coefficient vectors $w_1$ and $w_2$ each have a maximum component in a different dimension and are selected so that the sum of diagonal matrixes $W_1$ and $W_2$ using components of the weighting coefficient vectors as their diagonal elements becomes a constant multiple of the unit matrix.

41 Claims, 10 Drawing Sheets

FIG. 6A

TABLE I CODEBOOK CB1'

| i | $y_{1i1}$ | $y_{1i2}$ |
|---|---|---|
| 1 | 0.000010 | 0.185084 |
| 2 | 0.094719 | 0.296035 |
| 3 | 0.111779 | 0.613122 |
| 4 | 0.003516 | 0.659780 |
| 5 | 0.117258 | 1.134277 |
| 6 | 0.197901 | 1.214512 |
| 7 | 0.021772 | 1.801288 |
| 8 | 0.163457 | 3.315700 |

FIG. 6B

TABLE II CODEBOOK CB2'

| j | $y_{2j1}$ | $y_{2j2}$ |
|---|---|---|
| 1 | 0.050466 | 0.244769 |
| 2 | 0.121711 | 0.000010 |
| 3 | 0.313871 | 0.072399 |
| 4 | 0.375977 | 0.292399 |
| 5 | 0.493870 | 0.593410 |
| 6 | 0.556641 | 0.064087 |
| 7 | 0.645363 | 0.362118 |
| 8 | 0.706138 | 0.146110 |
| 9 | 0.809357 | 0.397579 |
| 10 | 0.866379 | 0.199087 |
| 11 | 0.923602 | 0.599938 |
| 12 | 0.925376 | 1.742757 |
| 13 | 0.942028 | 0.029027 |
| 14 | 0.983459 | 0.414166 |
| 15 | 1.055892 | 0.227186 |
| 16 | 1.158039 | 0.724592 |

VECTOR CODING METHOD, ENCODER USING THE SAME AND DECODER THEREFOR

Matter enclosed in heavy brackets [ ] appears in the original patent but forms no part of this reissue specification; matter printed in italics indicates the additions made by reissue.

BACKGROUND OF THE INVENTION

The present invention relates to a vector coding method that is used to encode speech, images and various other pieces of information and is particularly suited to encoding of information that is transmitted over an error-prone channel such as a mobile radio channel and encodes an input vector through the use of a plurality of codebooks each composed of plural representative vectors. The invention also pertains to a vector encoder using the above-mentioned vector coding method and a vector decoder for decoding codes encoded by the vector encoder.

Methods that have been proposed to transmit vectors over channels prone to channel errors set representative vectors in anticipation of possible channel errors and take into account the channel errors when labeling representative vectors. These methods are disclosed in Kumazawa, Kasahara and Namekawa, "A Communication of Vector Quantizers for Noisy Channels," Transactions of the Institute of Electronics, Information and Communication Engineers of Japan, Vol. J67-B, No. 1, pp. 1–8, 1984, Zeger and Gersho, "Pseudo-Gray Coding," IEEE Trans. on Comm., Vol. 38, No. 12, pp. 2147–2158, 1990, and other literature. These methods hold all representative vectors directly in one codebook, and hence require large storage capacity for storing the codebook.

As a method that does not need large storage capacity in transmitting vectors over channels prone to channel errors, it has been proposed to transmit vectors after quantizing them through the use of two structured codebooks. This is disclosed in Moriya, "Two-Channel Vector Quantizer Applied to Speech coding," Transactions of the Institute of Electronics, Information and Communication Engineers of Japan, IT87-106, pp. 25–30, 1987 and other literature. This method has two small-scale codebooks and uses two representative vectors in combination to reduce the storage capacity needed and transmits two labels indicative of the two representative vectors to lessen the influence of channel errors. This method will be described with reference to FIGS. 1A and 1B. The representative vectors of the codebooks are generated beforehand by learning, for instance. In an encoder depicted in FIG. 1A, one representative vector $Z_{1i}$ is fetched from a codebook CB1 and one representative vector $z_{2j}$ from a codebook CB2, then they are added together in a vector combining part 3 to generate a vector sum $Y_{ij}=z_{1i}+z_{2j}$, and the distance, $d(X,y_{ij})$, between the combined representative vector $y_{ij}$ and input vector X via an input terminal 4 is calculated, as distortion, in a distance calculating part 5. A control part 6 controls representative vector select switches 7 and 8 for the codebooks CB1 and CB2 and searches them for the representative vectors $z_{1i}$ and $z_{2j}$ that minimize the output $d(X,y_{ij})$ from the distance calculating part 5. The control part 6 provides, as encoded outputs to an output terminal 9, labels i and j of the representative vectors $z_{1i}$ and $z_{2j}$ that provides minimum distance.

In a decoder shown in FIG. 1B, the control part 6 controls representative vector select switches 13 and 14 in accordance with the labels i and j in the input code via an input terminal 11 and reads out representative vectors $z_{1i}$ and $z_{2j}$ from codebooks CB3 and CB4, respectively. The thus read-out representative vectors $z_{1i}$ and $z_{2j}$ are combined in a vector combining part 17 into a reconstructed vector $y_{ij}=z_{1i}+z_{2j}$, which is provided to an output terminal 18. Incidentally, the codebooks CB3 and CB4 are identical to CB1 and CB2, respectively.

The method described above in respect of FIGS. 1A and 1B reduces the storage capacity of the codebooks needed for storing the representative vectors and lessens the influence of channel errors by combining the vectors in the decoder through utilization of the two labels corresponding thereto.

With this method, however, if an error arises in the labels during transmission over the channel, then distortion will occur in all elements of the received vector. According to the circumstances, the error will cause an abnormally large amount of distortion in the decoded output.

Another problem of this method is that the amount of processing required is very large because it involves the calculation of the distance $d(X,y_{ij})$ for every combination of representative vectors of the two codebooks in search for the pair of representative vectors that minimizes the distance.

SUMMARY OF THE INVENTION

An object of the present invention is to provide a vector coding method that prevents an error in the input code to the decoder from causing serious distortion of its output.

Another object of the present invention is to provide a vector coding method that prevents an error in the input code to the decoder from causing serious distortion of its output and permits reduction of the amount of processing required.

Another object of the present invention is to provide a vector encoder that embodies the above-mentioned vector coding method.

Still another object of the present invention is to provide a vector decoder that decodes a vector encoded by the vector coding method that serves the above-mentioned objects.

According to the vector coding method and the encoder of the first aspect of the present invention, representative vectors from respective codebooks are combined and the distance between the combined representative vector and the input vector is calculated; in this instance, the representative vectors to be combined are those multiplied by predetermined different weighting coefficient vectors, each of which is composed of the same number of components. At least one of the components in each weighting coefficient vector assumes a maximum value, and the positions of the maximum components in the respective weighting coefficient vectors differ with the codebooks. The multiplication of each representative vector by the weighting coefficient vector is done on the representative vector read out of each codebook, or weighted representative vectors respectively premultiplied by the weighting coefficient vectors are prestored in each codebook.

According to the vector coding method and the vector encoder of a second aspect of the present invention, in the first aspect, the distribution of the set of weighted representative vectors multiplied by the weighting coefficient vectors for each codebook are approximated with straight lines, then the input vector is projected on each straight line and a plurality of weighted representative vectors present around the projection are chosen for each codebook. The thus chosen weighted representative vectors of the respective codebooks are combined in pairs and that one of the combined vectors which has the minimum distance to the input vector is selected as the combined representative vector.

In a third aspect, the present invention relates to a decoder for codes encoded into vectors according to the first or second aspect. The representative vectors read out of respective codebooks are multiplied by weighting coefficient vectors and the multiplied weighted representative vectors are combined into a reconstructed vector; the weighting coefficient vectors are selected in the same fashion as in the first aspect of the invention.

BRIEF DESCRIPTION OF THE DRAWINGS

FIG. 6A is a table showing a first codebook with weighted gain vectors stored therein;

FIG. 6B is a table showing a second codebook with weighted gain vectors stored therein;

DESCRIPTION OF THE PREFERRED EMBODIMENTS

Figure 1A:
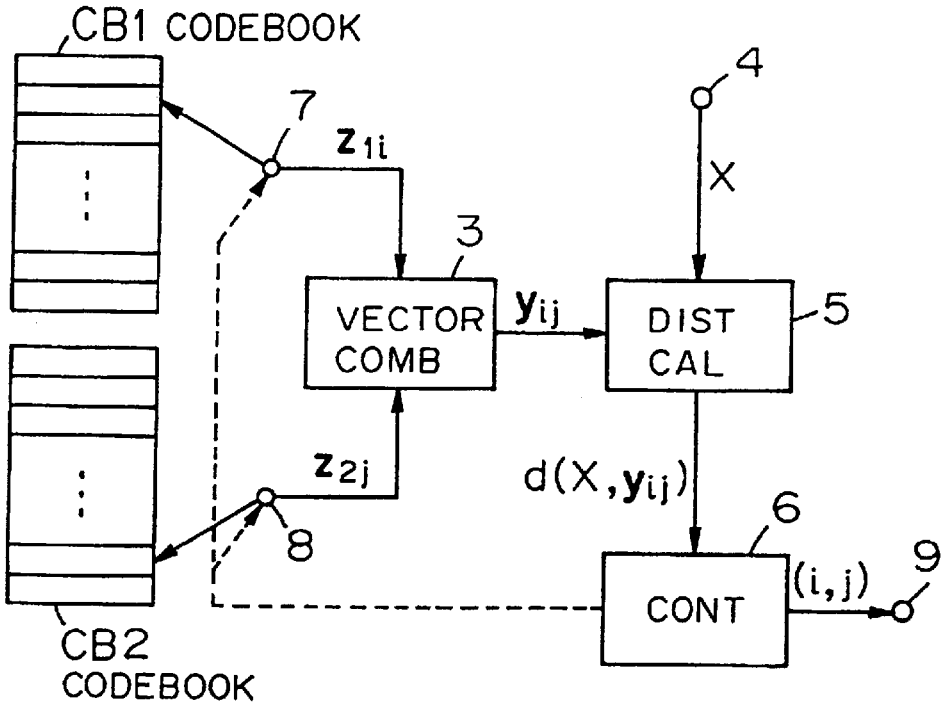
FIG. 1A PRIOR ART
FIG. 1A is a block diagram showing the configuration of an encoder embodying a conventional vector coding method.
Figure 1B:
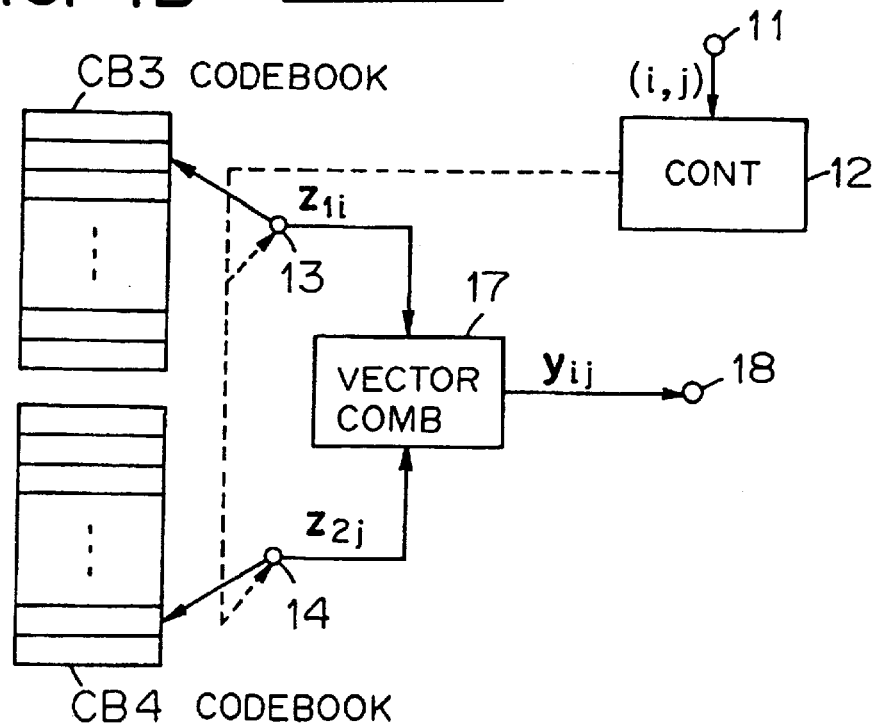
FIG. 1B PRIOR ART
FIG. 1B is a block diagram showing a conventional decoder for use with the encoder of FIG. 1A.
Figure 2A:
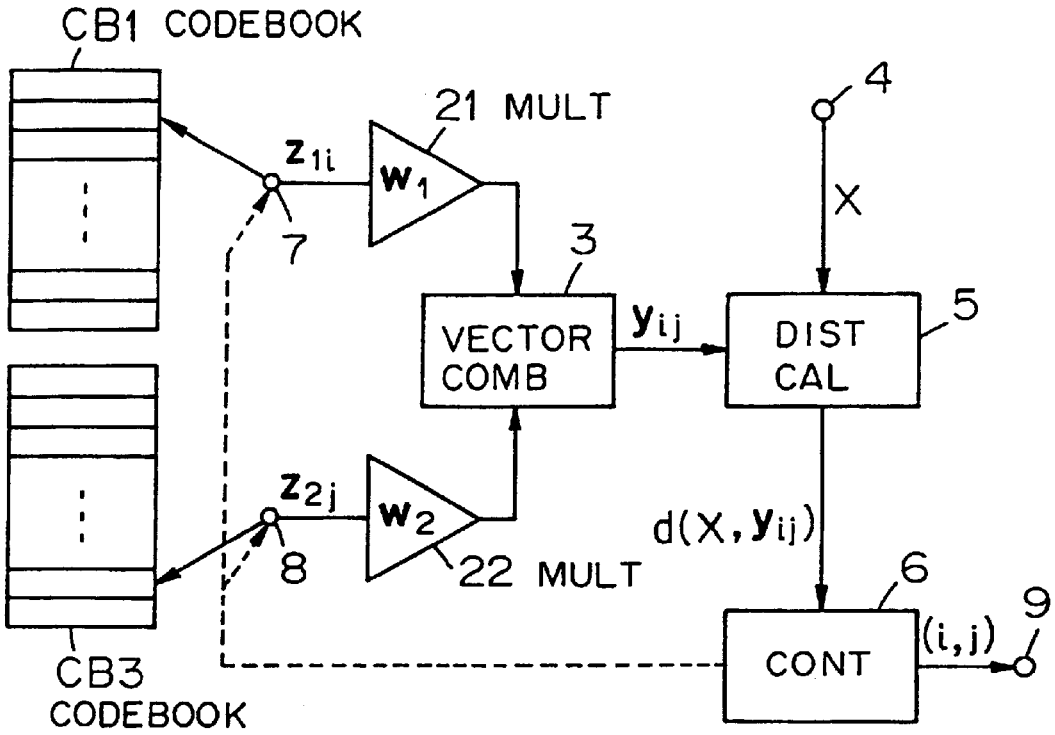
FIG. 2A is a block diagram illustrating an example of the encoder embodying the present invention.
Figure 2B:
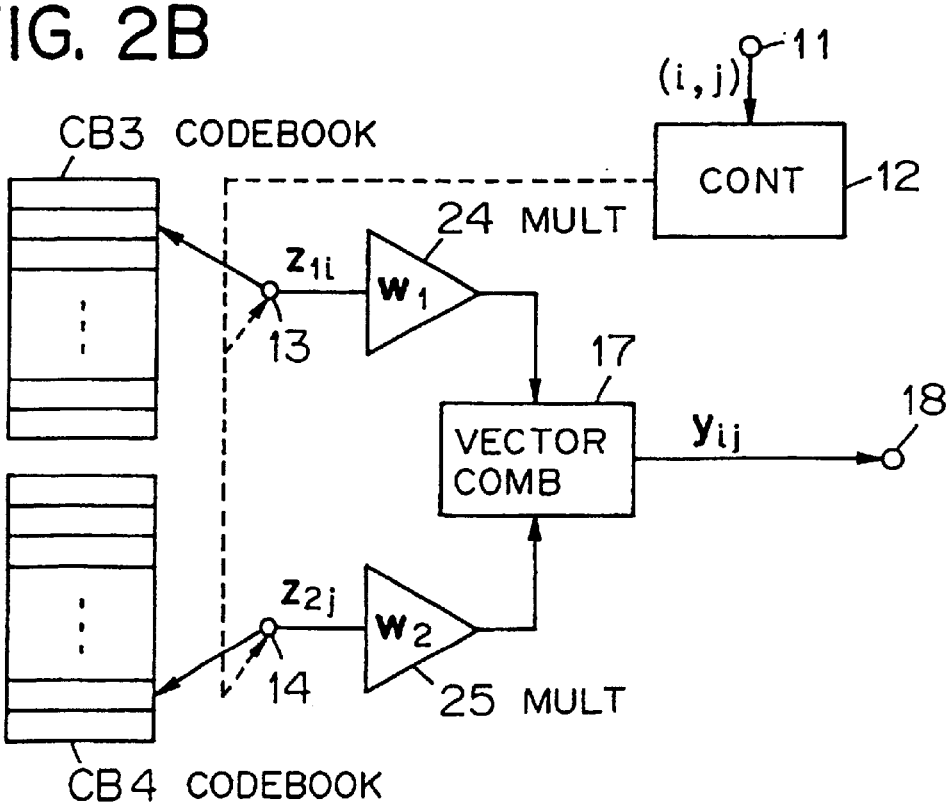
FIG. 2B is a block diagram illustrating an embodiment of the decoder according to the present invention.

In FIGS. 2A and 2B there are illustrated in block form an embodiment of the present invention, in which the parts corresponding to those in FIGS. 1A and 1B are identified by the same reference numerals. In the encoder of FIG. 2A, multipliers 21 and 22 are provided between the representative selection switches 7, 8 and the vector combining part 3, by which components of L-dimensional (where L is an integer equal to or greater than 2) representative vectors $z_{1i}=(z_{1i1}, z_{1i2}, \ldots, z_{1iL})$ and $z_{2j}=(z_{2j1}, z_{2j2}, \ldots, z_{2jL})$ selected from the codebooks CB1 and CB2 are multiplied by the corresponding components of L-dimensional weighting coefficient vectors $w_1=(w_{11}, w_{12}, \ldots, W_{1L})$ and $w_2=(w_{21}, W_{22}, \ldots, w_{2L})$, respectively. At least one of the L components forming each of the weighting coefficient vectors $w_1$ and $w_2$ assumes a maximum value and the positions of the maximum components in the respective weighting coefficient vectors $w_1$ and $w_2$ differ with the codebooks CB1 and CB2. According to the present invention, letting the weighting coefficient vectors $w_1$ and $w_2$ be represented by the following weighting coefficient matrixes $W_1$ and $W_2$ that have, as diagonal elements, the values $w_{11}, w_{12}, \ldots, W_{1L}$ of the components by which the respective components of the representative vectors are multiplied:

$$W_1 = \begin{bmatrix} w_{11} & 0 & \ldots & \ldots & 0 \\ 0 & w_{12} & 0 & \ldots & 0 \\ \vdots & 0 & \ddots & & \vdots \\ \vdots & \vdots & & \ddots & 0 \\ 0 & \ldots & \ldots & 0 & w_{1L} \end{bmatrix} \tag{1}$$

$$W_2 = \begin{bmatrix} w_{21} & 0 & \ldots & \ldots & 0 \\ 0 & w_{22} & 0 & \ldots & 0 \\ \vdots & 0 & \ddots & & \vdots \\ \vdots & \vdots & & \ddots & 0 \\ 0 & \ldots & \ldots & 0 & w_{2L} \end{bmatrix} \tag{2}$$

the weighting coefficient vectors $w_1$ and $w_2$ may preferably be selected so that the sum of the weighting coefficient matrixes $W_1$ and $W_2$ of the codebooks CB1 and CB2 becomes a constant multiple of the unit matrix as follows:

$$\begin{bmatrix} w_{11} & 0 & \ldots & \ldots & 0 \\ 0 & w_{12} & 0 & \ldots & 0 \\ \vdots & 0 & \ddots & & \vdots \\ \vdots & \vdots & & \ddots & 0 \\ 0 & \ldots & \ldots & 0 & w_{1L} \end{bmatrix} + \begin{bmatrix} w_{21} & 0 & \ldots & \ldots & 0 \\ 0 & w_{22} & 0 & \ldots & 0 \\ \vdots & 0 & \ddots & & \vdots \\ \vdots & \vdots & & \ddots & 0 \\ 0 & \ldots & \ldots & 0 & w_{2L} \end{bmatrix} = \begin{bmatrix} 1 & 0 & \ldots & \ldots & 0 \\ 0 & 1 & & & 0 \\ \vdots & & \ddots & & \vdots \\ \vdots & & & \ddots & 0 \\ 0 & 0 & \ldots & 0 & 1 \end{bmatrix} \times K \tag{3}$$

where K is a predetermined constant. Vectors $w_1Z_{1i}$ and $w_2Z_{2j}$, obtained by multiplying the representative vectors $z_{1i}$ and $z_{2j}$ by the weighting coefficient vectors $w_1$ and $w_2$, respectively, are combined in the vector combining part 3, and the codebooks CB1 and CB2 are searched for representative vectors $z_{1i}$ and $z_{2j}$ that minimize the distance between the combined vector $y_{ij}$ and the input vector X.

Figure 3A:
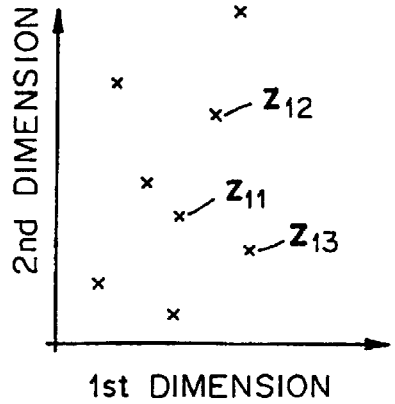
FIG. 3A is a graph showing each representative vector $z_{1i}$ of a codebook CB1.
Figure 3B:
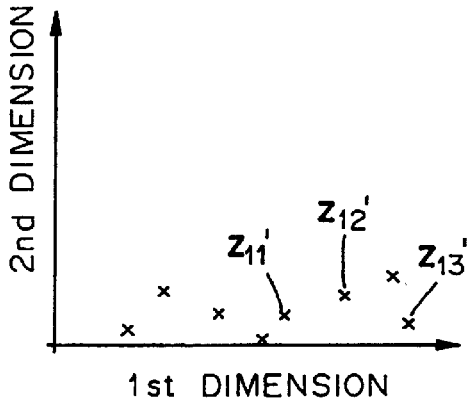
FIG. 3B is a graph showing a vector obtained by multiplying each representative vector $z_{1i}$ by a weighting coefficient vector $w_1$.
Figure 3C:
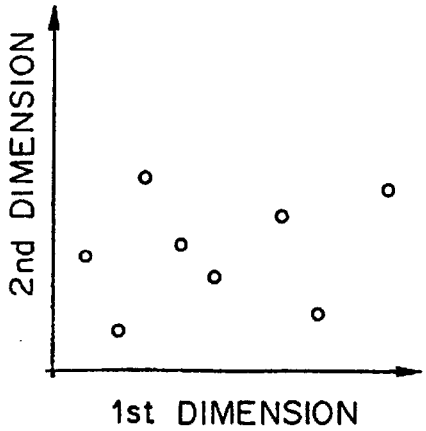
FIG. 3C is a graph showing each representative vector $z_{2j}$ of a codebook CB2.
Figure 3D:
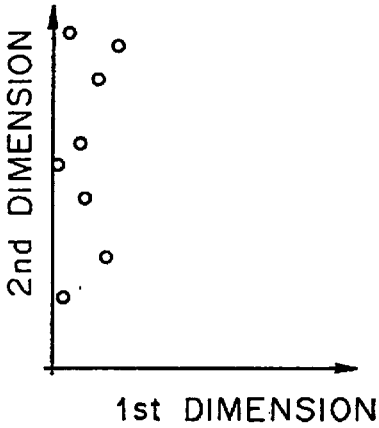
FIG. 3D is a graph showing a vector obtained by multiplying each representative vector $z_{2j}$ by a weighting coefficient vector $w_2$.

With such a configuration as described above, for example, when L=2, the representative vectors $z_{1i}$ and $z_{2j}$ are expressed by two-dimensional vectors $z_{1i}=(z_{1i1}, z_{1i2})$ and $z_{2j}=(z_{2j1}, z_{2j2})$, respectively. Suppose that k=2 and that the weighting coefficients which satisfy Eq. (3) are $W_1=(w_{11}=1.8, w_{12}=0.2)$ and $w_2=(w_{21}=0.2, w_{22}=1.8)$. Assuming that representative vectors $z_{11}, z_{12}, \ldots$ of the codebook CB1 are distributed substantially uniformly all over a plane of a certain two-dimensional range defined by $z_{1i1}$ in the first-dimensional direction and $z_{1i2}$ in the second-dimensional direction as shown in FIG. 3A, weighted representative vectors $z_{11}'$ and $z_{12}', \ldots$, obtained by multiplying each representative vector $z_{1i}=(z_{1i1}, z_{1i2})$ by the weighting coefficient vector $w_1=(1.8, 0.2)$, are concentrated close to the first-dimensional axis as shown in FIG. 3B. Similarly, assuming that representative vectors $z_{21}, z_{22}, \ldots$ of the codebook CB2 are distributed substantially uniformly all over the plane of a certain two-dimensional range defined by two axes as depicted in FIG. 3C, weighted representative vectors, obtained by multiplying the representative vectors $z_{21}, z_{22}, \ldots$ by the weighting coefficient vectors $w_2=(0.2, 1.8)$, are concentrated close to the second-dimensional axis as shown in FIG. 3D.

Figure 3E:
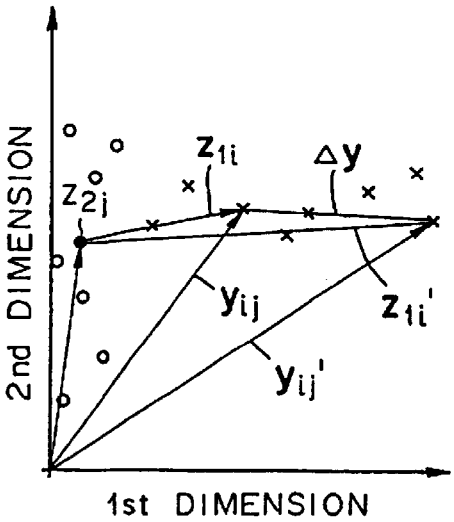
FIG. 3E is a graph showing examples of a combined vector and an erroneous combined vector in the present invention.
Figure 3F:
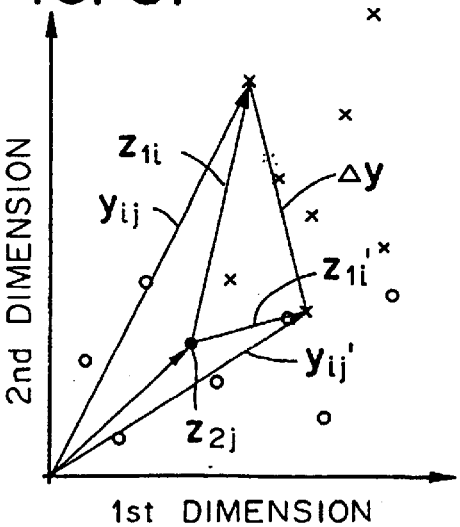
FIG. 3F is a graph showing examples of a combined vector and an erroneous combined vector in the prior art.

Suppose, for example, that when it is judged at the transmitting side that the weighted combined vector $y_{ij}$ of the representative vectors $z_{21}$ and $z_{1i}$ has the minimum distortion with respect to the input signal X, the label of the one weighted representative vector $z_{1i}$ becomes $z_{1i}'$ because of a channel error as shown in FIG. 3E. In this instance, the combined vector $y_{ij}$ changes to $y_{ij}'$ at the receiving side. There is a possibility that the weighted representative vector $z_{1i}$ changes to any other weighted representative vectors $z_{1i}'$, but since the vector $z_{1i}$ has a biased distribution, the value of the second-dimensional component of an error vector, $\Delta y=\Delta y_{ij}-y_{ij}'$, between the combined vectors $y_{ij}$ and $y_{ij}'$ is relatively small, no matter how much the vector $z_{1i}$ may change. In contrast to this, in the case where the combined vector is not multiplied by the weighting coefficient, if the one representative vector $z_{1i}$ changes to a representative vector $z_{1i}'$, combined vectors of these vectors $z_{1i}$ and $z_{1i}'$ and the other representative vector $z_{2j}$ become $y_{ij}$ and $y_{ij}'$, respectively, as shown in FIG. 3F. Since there is a likelihood of the representative vector $z_{1i}$ changing to any of the representative vectors of the codebook CB1 and since the representative vectors $z_{11}, z_{12}, \ldots$ are distributed over a wide range, the error vector $\Delta y$ between the combined vector $y_{ij}$ and the changed combined vector $y_{ij}'$ is likely to have appreciably large first- and second-dimensional components.

In other words, in the example of FIG. 3E, when the weighted representative vector $w_1z_{1i}=(w_{11}z_{1i1}, w_{12}z_{1i2})$ becomes $w_1z_{1i}'=(w_{11}z_{1i1}, w_{12}z_{1i1}')$ because of a channel error, distortion is concentrated on the first-dimensional component $w_{11}z_{1i1}'$ to keep down distortion of the second-dimensional component $w_{12}z_{1i2}'$, by which distortion is reduced as a whole.

FIG. 2B illustrates in block form an embodiment of the decoder of the present invention, which is supplied with the labels i and j and the weighting coefficient vectors $w_1$ and $w_2$ from the encoder of FIG. 2A and decodes the code $y_{ij}$. The decoder has the same codebooks CB3 and CB4 as CB1 and CB2 in FIG. 2A, reads out representative vectors of the labels i and j of the inputted code from the codebooks CB3 and CB4 and combines them as is the case with FIG. 1B. In this embodiment, multipliers 24 and 25 are provided between the switches 13, 14 and the vector combining part 17, by which representative vectors $z_{1i}$ and $z_{2j}$ read out of the codebooks CB3 and CB4 are multiplied by the same weighting coefficient vectors $w_1$ and $w_2$ as those used by the corresponding multipliers 21 and 22 of the FIG. 2A encoder. The thus multiplied representative vectors $w_1z_{1i}$ and $w_2z_{2j}$ are combined in the vector combining part 17 into the reconstructed vector $y_{ij}$. As will be evident from the above, it is also possible to omit the multipliers 21, 22, 24 and 25 by prestoring in the codebooks CB1, CB3 and CB2, CB4 in FIGS. 2A and 2B weighted representative vectors obtained by multiplying the representative vectors $z_{1i}$ and $z_{2j}$ by the weighting coefficient vectors $w_1$ and $w_2$, respectively.

In the encoder of FIG. 2A , the combined vector $y_{ij}$ is determined for every combination of representative vectors $z_{1i}$ and $z_{2j}$ prestored in the codebooks CB1 and CB2, then the distortion of each combined vector is calculated with respect to the input signal vector X, and a decision is made of which pair or representative vectors $z_{1i}$ and $z_{2j}$ provides the minimum distortion. With this method, however, the number of calculations increases sharply as the codebooks CB1 and CB2 increase in size. Next, a description will be given of a scheme which pre-selects small numbers of representative vectors $z_{1i}$ and $z_{2j}$ and determines the pair of representative vectors of the minimum distortion among them, thereby reducing the computational complexity and hence shortening the operation time.

Figure 4:
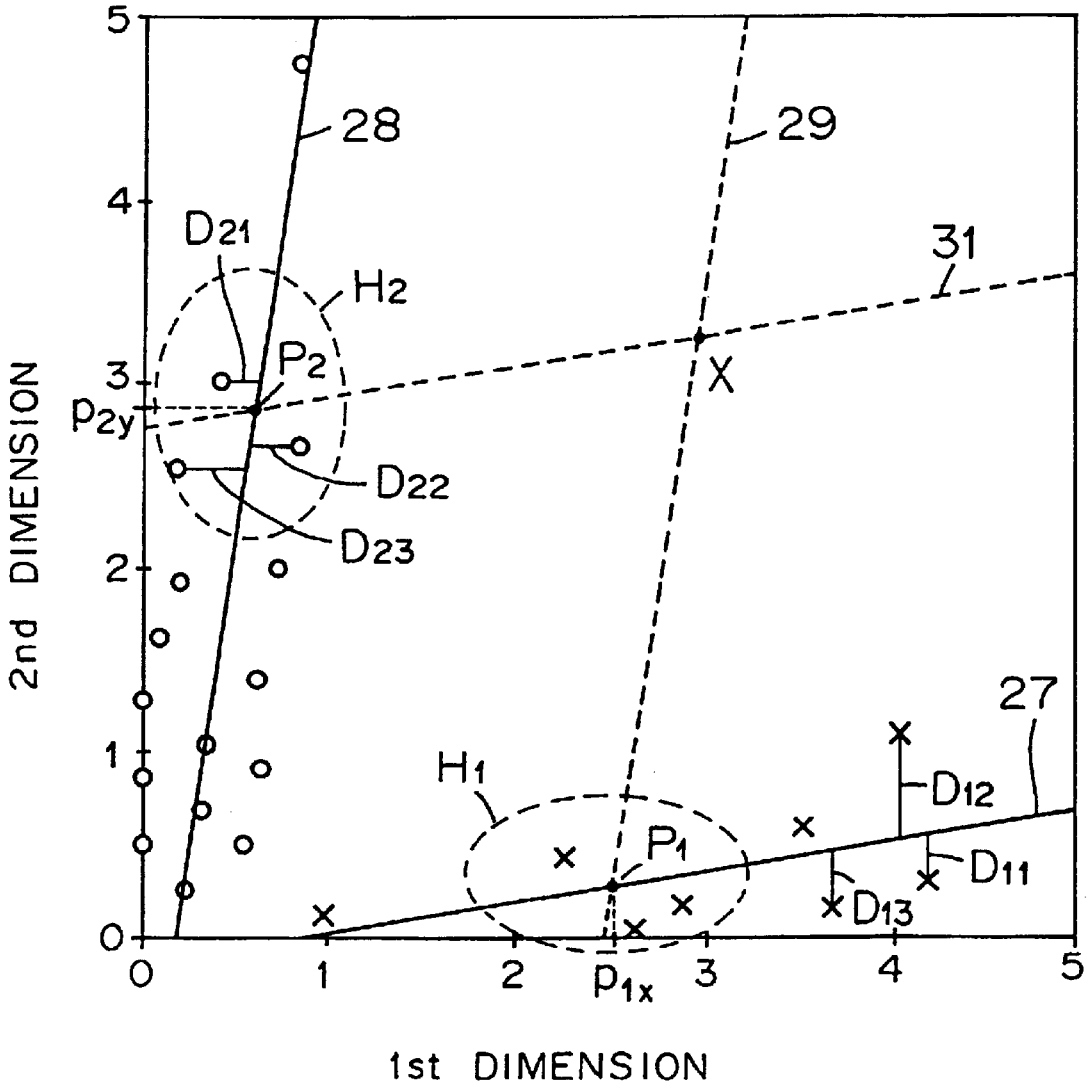
FIG. 4 is a graph showing a set of weighted representative vectors and a straight line for approximation, for explaining the vector coding method of the present invention.

Let is be assumed, for example, that the codebooks CB1 and CB2 in FIG. 2A have 8 and 16 representative vectors, respectively, and that the vectors $z_{1i}$ and $z_{2j}$ are all two-dimensional. In FIG. 4, eight weighted representative vectors, obtained by multiplying the eight representative vectors $z_{1i}$ of the codebook CB1 by the weighting coefficient vector $w_1=(w_{11}=1.8, w_{12}=0.2)$, are indicated by crosses; 16 weighted representative vectors, similarly obtained by multiplying the 16 representative vectors $z_{2j}$ of the codebook CB2 by the weighting coefficient vectors $w_2=(w_{21}=0.2, w_{22}=1.8)$, are indicated by white circles. The input signal vector is indicated by X, which is composed of a predetermined number of signal samples of each frame, two samples in this example.

The two-dimensional weighting coefficient vectors $w_1$ and $w_2$ for the two-dimensional vectors $z_{1i}$ and $z_{2j}$ are determined such that they satisfy Eq. (3); $w_{11}+w_{21}=w_{12}+w_{22}=2$ in this example. As depicted in FIG. 4, the weighted representative vectors marked with the white circles and the weighted representative vectors marked with the crosses are distributed separately on opposite sides of a straight line of a 45°-gradient passing through the origin (0, 0). The following description will be given on the assumption that there are stored such weighted representative vectors in the codebooks CB1 and CB2 in FIG. 2A and in the CB3 and CB4 in FIG. 2B, with the multipliers 21, 22, 24 and 25 left out.

With this scheme, the set of weighted representative vectors (indicated by the crosses) of the codebook CB1 is approximated with a straight line 27. That is, the straight line 27 is determined so that the sum of distances, $D_{11}, D_{12}, \ldots, D_{18}$, between it and the respective crosses (or distances in the second-dimensional axis direction) is minimum. Likewise, the set of weighted representative vectors indicated by the white circles) of the codebook CB2 is approximated with a straight line 28. The straight line 28 is also determined so that the sum of distances, $D_{21}, D_{22}, \ldots, D_{216}$, between it and the respective white circles (or distances in the first-dimensional axis direction) is minimum.

The input vector X is projected on the approximating straight lines 27 and 28 and pluralities of weighted representative vectors present around the projections are selected. That is, a calculation is made of the value on the abscissa and hence a first-dimensional value $p_{1x}$ at the intersection $P_1$ of a straight line 29 passing through the input signal vector X and parallel to the approximately straight line 28 and the approximating straight line 27, then the value $p_{1x}$ and first-dimensional values (values of first components) of the cross-marked weighted representative vectors having a wide first-dimensional distribution are compared, and a predetermined number, for example, three, of the weighted representative vectors are selected, as a subgroup $H_1$, in increasing order of the difference between the value $P_{1x}$ and the first-dimensional value of the respective weighted representative vector. In this way, the weighted representative vectors are pre-selected for the codebook CB1. Similarly, a calculation is made of a value on the ordinate and hence a second-dimensional value $p_{2y}$ at the intersection $P_2$ of a straight line 31 passing through the input signal vector x and parallel to the approximating straight line 27 and the approximating straight line 28, then the second-dimensional value $p_{2y}$ and second-dimensional values (values of second components) of the white-circled weighted representative vectors having a wide second-dimensional distribution, and a predetermined number, for example, three, of the weighted representative vectors are selected, as a subgroup $H_2$, in the order of increasing differences between the value $p_{2y}$ and the second-dimensional values of the weighted representative vectors. This is the pre-selection of the weighted representative vectors for the codebook CB2.

Only the weighted representative vectors thus pre-selected from the codebooks CB1 and CB2 are searched for a pair of weighted representative vectors that provides the minimum distance between their combined vector and the input signal vector. In this example, since three weighted representative vectors are pre-selected from each of the codebooks CB1 and CB2, the number of their combinations is nine, and hence the number of combined vectors is nine. When the pre-selection scheme is not adopted, the number of combinations of the weighted representative vectors (the number of combined representative vectors) is 8×16=128, and when the pre-selection is made, the number of calculations for the distance to the input signal vector X is reduced down to 9/128 of the number of calculations needed when no pre-selection takes place. In this pre-selection scheme, when M codebooks are used, the number of dimensions of representative vectors is also set to M. The M weighting coefficient vectors each have at least one maximum component at a different component position (that is, in a different dimension), and by multiplying the representative vector by the weighting coefficient vector, that dimension is emphasized more than the other dimensions.

Figure 5:
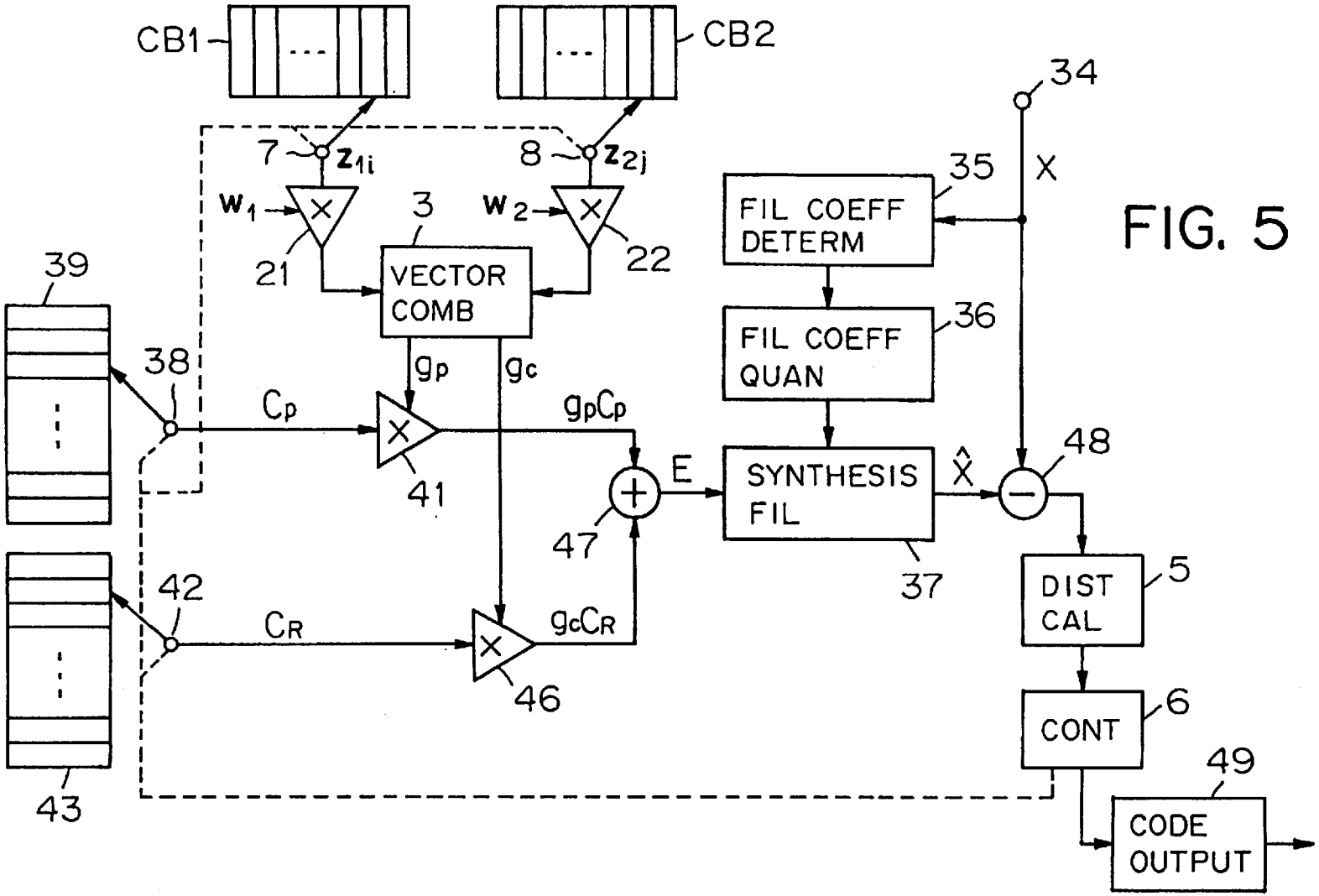
FIG. 5 is a block diagram illustrating an example of the encoder of the present invention applied to the CELP scheme.

FIG. 5 illustrates an embodiment of the coding method of the present invention applied to speech coding of the CELP (Code-Excited Linear Prediction Coding) system. In the CELP system, as disclosed by M. R. Schroeder and B. S. Atal in "Code-Excited Linear Prediction (CELP): High-Quality Speech at Very Low Bit Rates", Proc. ICASSP'85, pp. 937–940, 1985, for instance, pitch excitation vectors read out of a pitch excitation source codebook and random excitation vectors read out of a random excitation source codebook are respectively provided with gains and are combined in pairs, then the combined vectors are each fed as an excitation signal to a synthesis filter to obtain synthesized speech, then two vectors and two gains therefor are determined which minimize distortion of the synthesized speech with respect to input speech, and labels of these vectors and labels of the gains are outputted as encoded results of the input speech, together with the filter coefficients of the synthesis filter. By applying the vector coding method of the present invention to the encoding of the gains for the two vectors in the CELP system, it is possible to prevent the occurrence of gross distortion in the decoded or reconstructed speech by a channel error in the codes representing the gains.

The input speech signal X fed via an input terminal 34 is sampled with a fixed period and is expressed as a vector that is provided as a sequence of digital sample values for each frame period. The input signal vector X of every frame is subjected to, for example, an LPC analysis in a filter-coefficient determining part 35, from which linear predictive coefficients are provided. The linear predictive coefficients are used to calculate a spectrum envelope parameter, which is quantized in a filter coefficient quantizing part 36, and the quantized value is set as the filter coefficient of a synthesis filter 37. In a pitch excitation source codebook 39 there are stored sequences of sample values of waveforms respectively containing different pitch period components and labeled as pitch excitation vectors. In a random-excitation source codebook 43 there are stored sequences of sample values of various random waveforms respectively labeled as random-excitation vectors. The pitch-excitation vectors and the random-excitation vectors stored in the pitch-excitation source codebook 39 and the random-excitation source codebook 43 are each composed of components of the same number as that of samples of one frame. A selection switch 38 is controlled by the control part 6 to select one of the pitch-excitation vectors in the pitch-excitation source codebook 39, and the selected pitch-excitation vector is multiplied by a given gain in a gain providing part 41, thereafter being applied to the synthesis filter 37. The difference between synthesized speech Xp from the synthesis filter 37 and the input speech signal X is calculated by a subtractor 48, and in the distortion calculating part 5 the difference is used to calculate distortion D as $D=\|X-Xp\|^2$. Similarly, the other pitch-excitation vectors are sequentially taken out from the pitch-excitation source codebook 39 via the switch 38 under the control of the control part 6, then the above-mentioned distortion is calculated for each pitch-excitation vector, and the pitch-excitation vector of the minimum distortion is determined. Next, one of the random-excitation vectors stored in the random-excitation source codebook 43 is taken out through a switch 42 and amplified by a given gain in a gain providing part 46, thereafter being fed to an adder 47 wherein it is combined with the already determined pitch-excitation vector into an excitation signal vector E. The excitation signal vector E is provided to the synthesis filter 37 to generate synthesized speech and its distortion with respect to the input speech signal is similarly calculated. Likewise, such distortion is also calculated for each of the other remaining random-excitation vectors in the random-excitation source codebook 43 and the random excitation vector of the minimum distortion is determined.

After the selection of the pitch excitation vector and the random excitation vector as mentioned above, gains $g_p$ and $g_c$ of the gain providing parts 41 and 46 are so determined as to minimize the distortion as described hereafter. In gain codebooks CB1 and CB2 there are stored gain vectors $z_{1i}$ (where i=1, . . . , a) and $z_{2j}$ (where j=1, . . . , b), respectively.

The gain vectors $z_{1i}$ and $z_{2j}$ are each composed of two components and expressed as $z_{1i}=(z_{1i1}, z_{1i1})$ and $z_{2j}=(z_{2j1}, z_{2j2})$, respectively. The gain vectors $z_{1i}$ and $z_{2j}$ taken out of the gain codebooks CB1 and CB2 are multiplied by weighting coefficient vectors $w_1=(w_{11}, w_{12})$ and $w_2=(w_{21}, w_{22})$ by multipliers 21 and 22, respectively, from which weighted gain vectors $y_i=(y_{i1}, y_{i2})$ and $y_j=(y_{ji}, y_{j2})$ are provided. Here, $$y_{i1-z1i1}w'_{11},\ y_{12}=z_{1i2}w_{12},\ y_{j1}=z_{2j1}w_{21},\ y_{j2}=z_{2j2}w_{22} \tag{4}$$

In a vector combining part 3 the weighted gain vectors $y_i$ and $y_j$ are combined into a combined gain vector $G=(g_p, g_c)$ which is composed of such components as follows:

$$g_p=y_{i1}+y_{j1},\ g_c=y_{i2}+y_{j2} \tag{5}$$

The first and second components $g_p$ and $g_c$ of the combined gain vector G are provided as first and second gains to the gain providing parts 41 and 46, wherein they are used to multiply the pitch excitation vector $C_p$ and the random excitation vector $C_R$ from the pitch excitation source codebook 39 and the random excitation source codebook 43, respectively.

The pitch excitation vector $g_pc_p$ and the random excitation vector $g_cC_R$ multiplied by the gains $g_p$ and $C_R$ in the gain providing parts 41 and 46, respectively, are added together by the adder 47 and the added output is fed as an excitation vector $E=g_pC_p+g_cC_R$ to the synthesis filter 37 to synthesize speech $\hat{X}$. The difference between the synthesized speech $\hat{X}$ and the input speech signal X is calculated by the subtractor 48 and the difference is provided to the distortion calculating part 5, wherein $D=\|X-\hat{X}\|^2$ is calculated as the distortion of the synthesized speech $\hat{X}$ with respect to the input speech signal X. The control part 6 controls the selection switches 7 and 8 to control the selection of the gain vectors of the gain codebooks CB1 and CB2, and the selected gain vectors $z_{1i}$ and $z_{2j}$ are multiplied by the different weighting coefficient vectors $w_1$ and $w_2$ by the multipliers 21 and 22, respectively, thereafter being provided to the vector combining part 3. The weighting coefficient vectors $w_1$ and $w_2$ are two-dimensional vectors that satisfy Eq. (3), and the two elements of each vector differ from each other. The gain vectors of the codebooks CB1 and CB2 are selected so that they minimize the distortion which is calculated in the distortion calculating part 5. Upon selection of the gain vectors that minimize the distortion, gain labels indicating the selected gain vectors of the gain codebooks CB1 and CB2, labels indicating the excitation vector and the random excitation vector of the pitch excitation source codebook 39 and the random excitation source codebook 43 determined as described previously and label indicating the filter coefficient set in the synthesis filter 37 are outputted, as encoded results of the input speech signal X, from a code outputting part 49.

Figure 7:
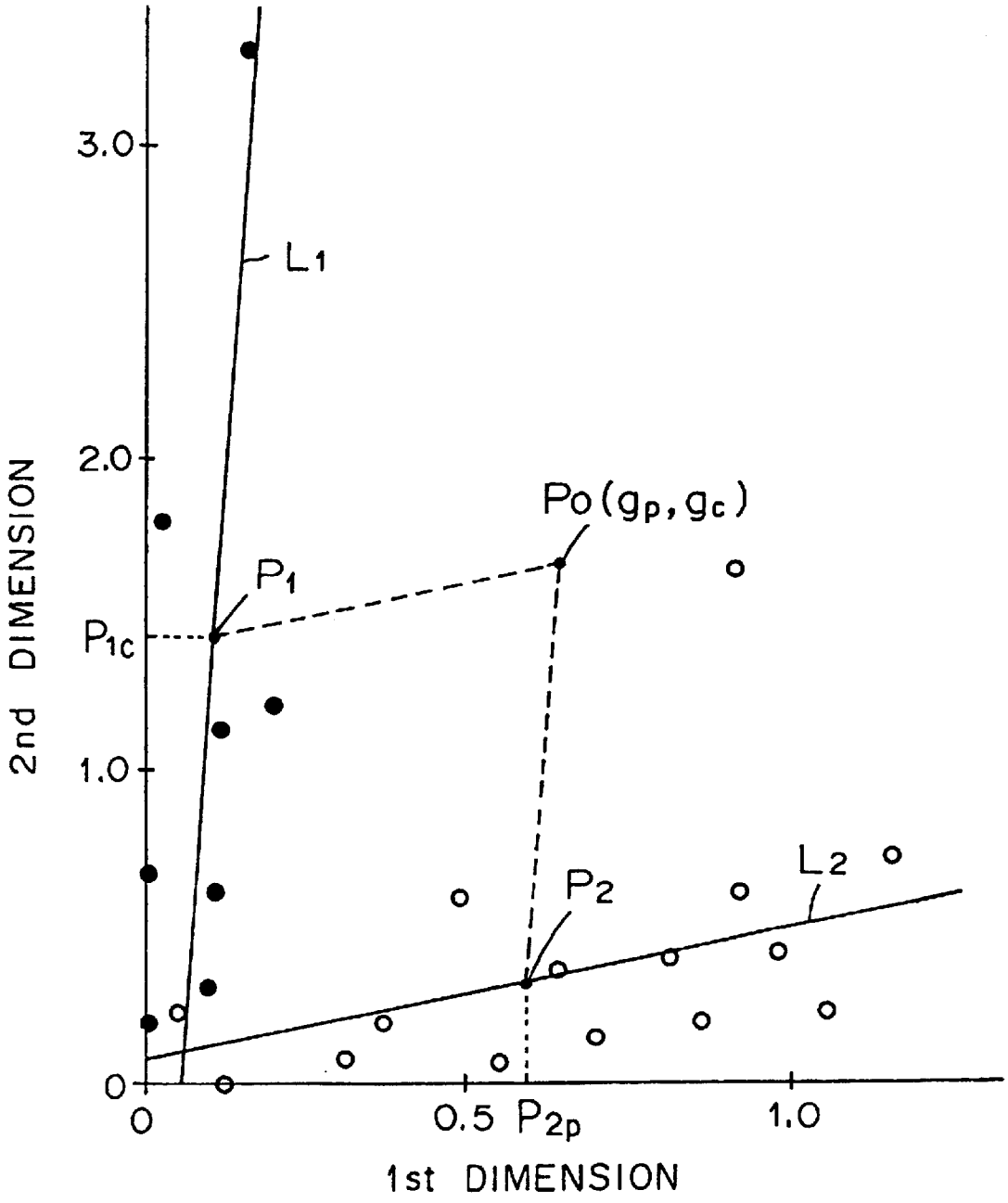
FIG. 7 is a graph showing weighted gain vectors of FIGS. 6A and 6B on a coordinate system.

In the FIG. 5 embodiment, the distortion is calculated for every combination of gain vectors selected from the gain codebooks CB1 and CB2 so as to determined the pair of gain vectors that provides the minimum distortion. As referred to previously with respect to FIG. 4, however, the pair of gain vectors, which provides the minimum distortion, may also be determined by pre-selecting pluralities of candidates of gain vectors $z_{1i}$ and $z_{2j}$ and calculating the distortion for every combination of such pre-selected gain vectors in the case where they are combined with the pitch excitation vector $C_P$ and the random excitation vector $C_R$. In this instance, as is the case with FIG. 4, weighted gain codebooks CB1' and CB2' are prepared, for example, as Tables I and II as shown in FIGS. 6A and 6B, by precalculating weighted gain vectors $$y_{1i}=z_{1i}w_1=(z_{1j1}w_{11},\ z_{1j2}w_{12})=(y_{1j1},\ y_{1j2})$$

$$y_{2j}=z_{2j}w_2=(z_{2j1}w_{21,\ z2j2}w_{22})=(y_{2j1},\ y_{2j2})$$

which are the products of the gain vectors $z_{1i}$ and $z_{2j}$ of the gain codebooks CB1 and CB2 and the weighting coefficient vectors $w_1=(w_{11}, w_{12})$ and $w_2=(w_{21}, w_{22})$, and the codebooks CB1' and CB2' are used as substitutes for the codebooks CB1 and CB2 in FIG. 5 and the multipliers are left out. As in the case of FIG. 4, all two-dimensional weighted vectors $y_{1i}$ of the weighted gain codebook CB1' are plotted as points on a two-dimensional coordinate system as indicated by black circles in FIG. 7 and a straight line $L_1$ closest to the group of such points is precalculated by the method of least squares. Similarly, all two-dimensional weighted vectors $y_{2j}$ of the weighted gain codebook CB2' are plotted as points on the two-dimensional coordinate system as indicated by white circles in FIG. 7 and a straight line $L_2$ closest to the group of such points as precalculated by the method of least squares.

As is the case with the FIG. 5 example, the gains of the gain providing parts 41 and 46 are set arbitrary and the pitch excitation vector $C_P$ that provides the minimum distortion is determined, which is followed by the determination of the random excitation vector $C_R$ that provides the minimum distortion. Next, the output $\hat{X}_P$ from the synthesis filter 37 is measured when only the pitch excitation vector $C_P$ is applied thereto as an excitation signal with the gains $g_p=1$ and $g_c=0$. Likewise, the output $\hat{X}_R$ from the synthesis filter 37 is measured when only the random excitation vector $C_R$ is applied thereto as an excitation signal with the gains $g_p=0$ and $g_c=1$. Since the synthesized speech output $\hat{X}$ from the synthesis filter 37, which is provided when the vectors $C_P$ and $C_R$ selected from the codebooks 39 and 43 are multiplied by the gains $g_p$ and $g_c$, respectively, is expressed as $\hat{X}=g_p\hat{X}\ P+g_c\hat{X}_R$, the distortion D of the synthesized speech $\hat{X}$ with respect to the input speech signal X is given by the following equation:

$$D=\|X-g_p\hat{X}p-g_c\hat{X}R\|^2 \tag{6}$$

$$=X'X+g_p{}^2\hat{X}p^t\hat{X}p+g_c{}^2\hat{X}_R{}^t\hat{X}_R-$$

$$2g_p\hat{X}'\hat{X}_p-2g_c\hat{X}'\hat{X}_R-2g_pg_c\hat{X}p^t\hat{X}_R$$

where t indicates a transposition. By partially differentiating the above equation by the gains $g_p$ and $g_c$ to obtain those which minimize the distortion D, the following equations are obtained:

$$\partial D/\partial g_p=2g_p\hat{X}_p-2\hat{X}^t\hat{X}_p-2g_c\hat{X}_p{}^t\hat{X}_R \tag{7}$$

$$\partial D/\partial g_c=2g_c\hat{X}_R{}^t\hat{X}_R-2\hat{X}^t\hat{X}_R-2g_p\hat{X}_p{}^t\hat{X}_R \tag{8}$$

Since the distortion D is a downward convex function with respect to each of the gains $g_p$ and $g_c$ as is evident from Eq. (6), the gains $g_p$ and $g_c$ that minimize the distortion D are values when $\partial D/\partial g_p=0$ and $\partial D/\partial g_c=0$. Hence, we have $$g_p\hat{X}_p{}^t\hat{X}_p-g_c\hat{X}_p{}^t\hat{X}_R=\hat{X}^t\hat{X}_P \tag{9}$$

$$-g_c\hat{X}_p{}^t\hat{X}_R+g_c\hat{X}_R{}^t\hat{X}_R=\hat{X}^t\hat{X}_R \tag{10}$$

from Eqs. (7) and (8), respectively. From the following equation, $$\begin{bmatrix} \hat{X}'_P\hat{X}_P & -\hat{X}'_P\hat{X}_R \\ -\hat{X}'_P\hat{X}_R & \hat{X}'_R\hat{X}_R \end{bmatrix}\begin{bmatrix} g_p \\ g_c \end{bmatrix} = \begin{bmatrix} \hat{X}'\hat{X}_P \\ \hat{X}'\hat{X}_R \end{bmatrix} \tag{11}$$

the gains $g_p$ and $g_c$ that satisfy Eqs. (9) and 10) simultaneously are expressed as follows:

$$\begin{bmatrix} g_p \\ g_c \end{bmatrix} = \begin{bmatrix} \hat{X}'_P\hat{X}_P & -\hat{X}'_P\hat{X}_R \\ -\hat{X}'_P\hat{X}_R & \hat{X}'_R\hat{X}_R \end{bmatrix}^{-1}\begin{bmatrix} \hat{X}'\hat{X}_P \\ \hat{X}'\hat{X}_R \end{bmatrix} \tag{12}$$

Expanding Eq(12), the gains $g_p$ and $g_c$ are given by the following equations, respectively:

$$g_p=k\{\hat{X}_R{}^t\hat{X}_R.\hat{X}^t\hat{X}_p+\hat{X}_p{}^t\hat{X}_R.\hat{X}^t\hat{X}_R\} \tag{13}$$

$$g_c=k\{\hat{X}_P{}^t\hat{X}_P.\hat{X}^t\hat{X}_R+\hat{X}_P{}^t\hat{X}_R.\hat{X}^t\hat{X}_P\} \tag{14}$$

where $k=1/(\hat{X}_p{}^t\hat{X}_p.\hat{X}_R{}^t\hat{X}_R-2\hat{X}_P{}^t\hat{X}_R)$. The pair of gains $\{g_p, g_c\}$ thus obtained is the combination of gains that minimizes the distortion D. This pair is plotted as the optimum gain vector as indicated by a point $P_o$ in FIG. 7 and straight lines parallel to the straight lines $L_2$ and $L_1$ are drawn from the point $P_o$, determining their intersections $P_1$ and $_2$ with the lines $L_1$ and $L_2$. A plurality of weighted gain vectors $y_{1i}=(y_{1i1}, y_{1i2})$ whose ordinate values are close to the point $P_1$ are selected from the codebook CB1' (Table I shown in FIG. 6A) to form a first subgroup. Similarly, a plurality of weighted gain vectors $y_{2j}=(y_{2j1}, y_{2j2})$ whose absicissa values are close to the point $p_2$ are selected from the codebook CB2' (Table II shown in FIG. 6B) to form a second subgroup.

In this case, predetermined numbers of weighted gain vectors (for example, four from Table I with respect to the point $P_1$ and eight from Table II with respect to the point $P_2$) are selected in increasing order of distance from the points $P_1$ and $P_2$. Another method is to select weighted gain vectors that lie within predetermined distances $d_1$ and $d_2$ from the points $P_1$ and $P_2$, respectively. Alternatively, since eight vectors $y_{1i}$ are prestored in the codebook CB1', mean values of i=n−th and i=(n+4)th ones of the gain components $y_{1i2}$ are calculated for n=1, 2, 3, 4, respectively, and the thus obtained values are set as threshold values $Th_1$, $Th_2$, $Th_3$ and $Th_4$. If the ordinate value $p_{1c}$ at the intersection $P_1$ is $p_{1c} \leqq Th_1$, the (i=1, . . . , 4)th weighted gain vectors are selected and if $Th_n<P_{1c}<Th_n+1$ where n=1, 2, 3, 4,, then (i=n+1, . . . , n+4)th weighted gain vectors are selected. Similarly, since the number of vectors $y_{2j}$ stored in the codebook CB2' is 16, mean values of (j=m)th and (j=m+8)th ones of gain components $y_{2ji}$ are calculated for m=1, . . . , 8, respectively, and the values thus obtained are set as threshold values $Th_1$, . . . , $Th_g$. If the abscissa value $p_{2p}$ at the intersection $P_2$ is $p_{2p}<Th_1$, (j=1, . . . , 8)th weighted gain vectors are selected, and if $Th_{m<p2p} \leqq Th_{m+1}$ where m=1, . . . 8, (j=m+1, . . . , m+8)th vectors are selected. It is also possible to use various other selecting methods.

A description will be given of still another method of pre-selecting candidates of vectors from the codebooks without using the aforementioned approximating straight lines $L_1$ and $L_2$ based on the method of least squares. At first, the synthesized speech signal $X_p$ is measured when only the pitch excitation vector $C_P$ from the pitch excitation source codebook 39 is provided as the excitation signal vector E to the synthesis filter 37, with the gain vectors set to $g_p$=1 and $g_c$=0. Similarly, the synthesized speech signal $X_C$ is measured when only the random excitation vector $C_R$ from the random excitation source codebook 43 is provided as the excitation signal vector E, with the gain vectors set to $g_p$=0 and $g_c$=1. For the pre-selection of the gain vectors stored in the gain codebook CB1, a value $D_1$ (i) is calculated for every i as follows:

$$D_1(i)=\|X-w_{11}z_{1j2}\hat{X}_p\|^2 \tag{15}$$

Then, a predetermined number, for example, three, of gain vectors are pre-selected from the gain codebook CB1 in increasing order of the value $D_1$ (i). For the pre-selection of the gain vectors stored in the gain codebook CB2, a value $D_2$ (j) is similarly calculated for every j as follows:

$$D_2(j)=\|X-w_{11}z_{2j2}\hat{X}_c\|^2( \tag{16}$$

then, a predetermined number, for example, three, of gain vectors are pre-selected from the gain codebook CB2 in increasing order of the value $D_2$ (j). Only for the triplets of gain vectors $z_{1i}$ and $Z_{2j}$ thus pre-selected from the codebooks CB1 and CB2, a value D(i,j) is calculated as follows:

$$D(ij)=\|X-(w_{11}z_{1j1}+w_{12}z_{1j2})\hat{X}_p-(w'_{12}z_{2j1}+w'_{11}z_{2j2})\hat{X}_c\|^2 \tag{17}$$

Then, i and j that minimize the value are provided as encoded outputs. This method also permits reduction of the computational complexity involved.

All pairs of thus pre-selected weighted gain vectors that are selected one by one from the first and second subgroups, respectively, are searched for a pair or weighted gain vectors that provide the minimum distortion from the input speech signal X, that is, an optimum pair of first and second gains $g_p$ and $g_c$ is thus determined and combined. Then, labels, which represent the pair of pitch excitation vector and random excitation vector determined previously and the combined gain vector ($g_p$, $g_c$), that is, a label of the pitch excitation vector in the pitch excitation source codebook 39, a label of the random excitation vector in the random excitation source codebook 43, labels of the gain vectors in the weighted gain codebooks CB1' and CB2' (or gain codebooks CB1 and CB2) and a label produced by quantizing the filter coefficient are outputted as encoded results of the input speech vector X.

At any rate, the multiplication of the weighting coefficient vectors $w_1$ and $w_2$ by the multipliers 21 and 22 begins to bring about the effect of preventing a channel error from seriously distorting the decoded output when the ratio of corresponding components, for example, $w_{11}$ and $w_{21}$ of the weighting coefficient vectors exceeds a value 2:1. Even if the ratio is set to 10:1 or more, however, the distortion by the channel error cannot appreciably be improved or suppressed; on the contrary, the decoded output is rather distorted seriously when no channel error arises, that is, when the channel is normal.

In the FIG. 5 embodiment, the weighting coefficient vectors, the weighted gain vectors and the combined gain vector have all been described to be two-dimensional vectors with a view to providing gains to the excitation vectors read out from both of the pitch excitation source codebook 39 and the random excitation source codebook 43. In the CELP system, however, there are cases where pluralities of pitch excitation source codebooks and random excitation source codebooks (which will hereinafter be referred to simply as excitation source codebooks) are provided and excitation vectors read out of the excitation codebooks are respectively multiplied by gains and combined into the excitation signal vector E. In general, according to the present invention, when M excitation gain codebooks are used, M gain codebooks (or weighted gain codebooks) are prepared to provide gains to M excitation vectors and the combined gain vector, the weighting coefficient vectors and the weighted gain vectors are all set to M-dimensional vectors accordingly.

Figure 8:
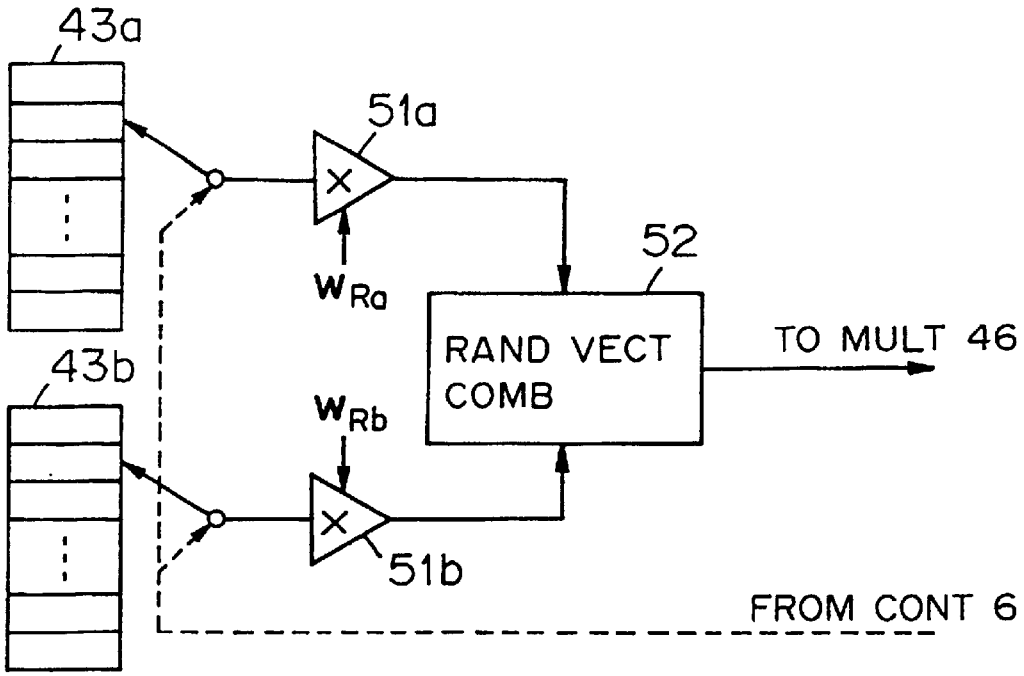
FIG. 8 is a block diagram illustrating the encoder of the present invention applied to the quantization of random excitation vectors.

In the FIG. 5 embodiment, the random excitation source codebook 43 may be formed by a plurality of codebooks. For example, as shown in FIG. 8, the random excitation source codebook 43 is formed by two codebooks 43a and 43b; in this instance, one random excitation vector is selected from either of the codebooks 43a and 43b and the thus selected random excitation vectors are multiplied by weighting coefficient vectors $w_{Ra}$ and $w_{Rb}$ by weighting coefficient multipliers 51a and 51b, respectively. The weighting coefficient vectors $w_{Ra}$ and $w_{Ra}$ are selected such that they bear the same relationship as that between the weighting coefficient vectors $w_1$ and $w_2$ described previously with reference to FIG. 2A. The outputs from the multipliers 51a and 51b are combined in a random vector combining part 52 and the combined output is provided, as the random excitation vector selected from the random excitation source codebook 43 in FIG. 5, to the gain providing part 46. As described previously with respect to FIG. 5, random excitation vectors are selected from the random excitation source codebooks 43a and 43b under the control of the control part 6 in such a manner that the distortion of the synthesized speech signal $\hat{X}$ from the input speech signal X becomes minimum.

Figure 9:
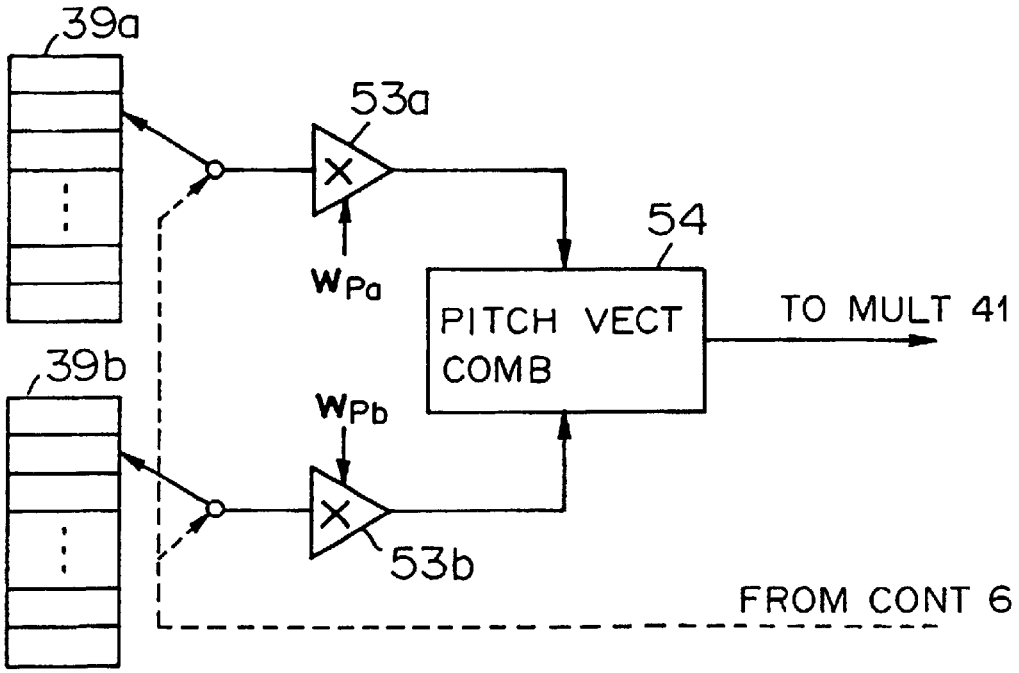
FIG. 9 is a block diagram illustrating the encoder of the present invention applied to the quantization of pitch excitation vectors.

As is the case with the encoding of the random excitation vector, the present invention is also applicable to the encoding of the pitch excitation vector in the configuration of FIG. 5. That is to say, as shown in FIG. 9, the pitch excitation source codebook is formed by two codebooks 39a and 39b; one pitch excitation vector is selected from either of the codebooks 39a and 39b, then they are multiplied by weighting coefficient vectors $w_{Pa}$ and $w_{pb}$ by weighting coefficient multipliers 53a and 53b, respectively, then these multiplied outputs are combined in a pitch excitation vector combining part 54, and the combined output is provided, as the pitch excitation vector selected from the pitch excitation source vector codebook 43 in FIG. 5, to the multiplier 41. The weighting coefficient vectors $w_{Pa}$ and $_{wPb}$ that are set in the multipliers 53a and 53b are determined in the same fashion as the weighting coefficient vectors $w_1$ and $w_2$ in FIG. 2A.

The present invention can be applied to the quantization in the filter coefficient quantizing part shown in FIG. 5 by configuring the filter coefficient quantizing part 36 in the same manner as depicted in FIG. 2A. That is, representative spectrum envelope vectors are prestored in the codebooks CB1 and CB2 in FIG. 2A, then one representative spectrum envelope vector selected from either of the codebooks CB1 and CB2 is multiplied by the corresponding one of the weighting coefficient vectors $w_1$ and $w_2$, and the multiplied vectors are combined in the vector combining part 3. The representative spectrum envelope vectors that are selected from the codebooks CB1 and CB2 are searched for a combination of representative spectrum envelope vectors that provide the minimum distance between their combined vector and the input spectrum envelope vector from the filter coefficient determining part 35 (FIG. 5).

Figure 10:
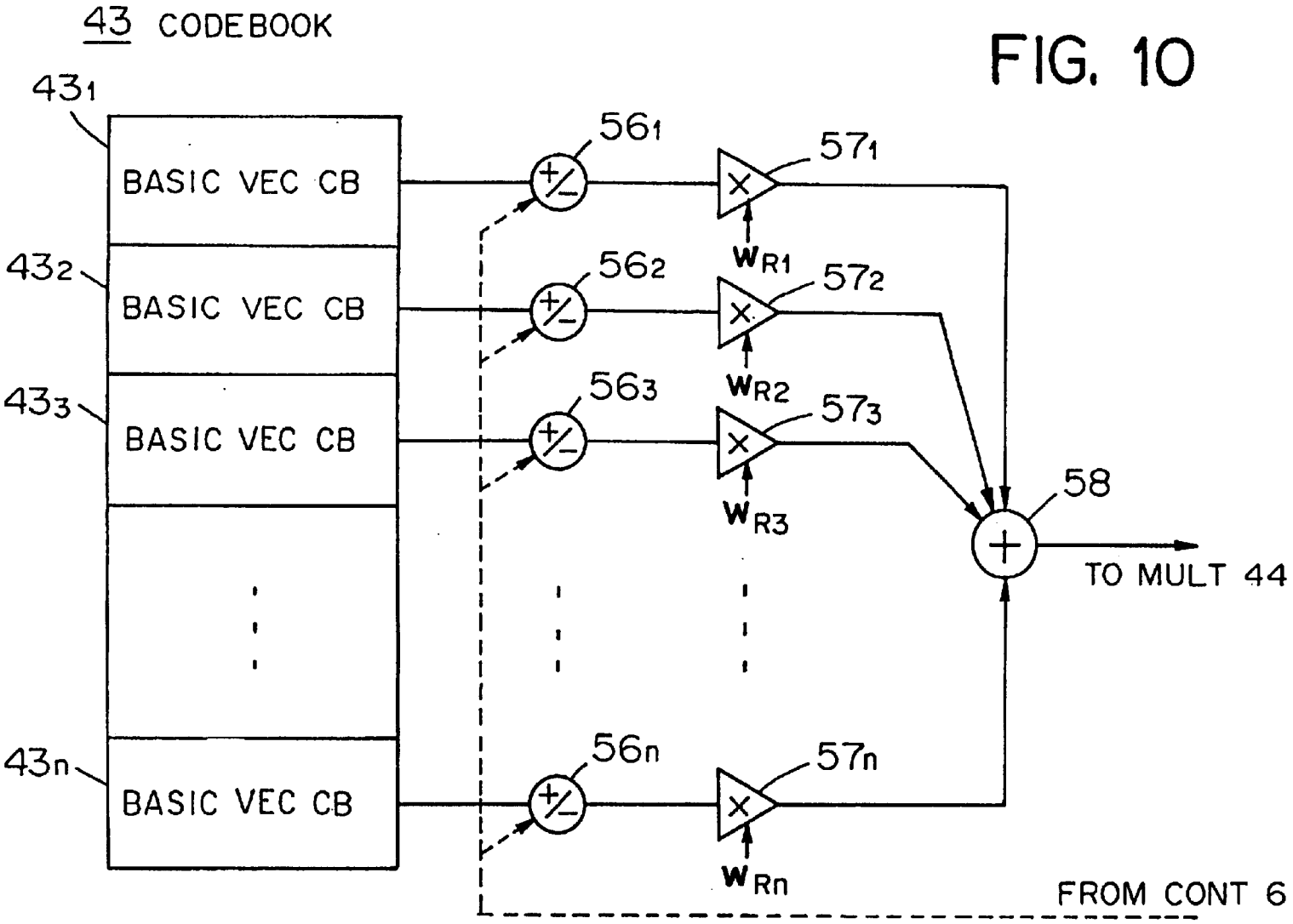
FIG. 10 is a block diagram illustrating the encoder of the present invention applied to the VSELP scheme.

The vector coding method of the present invention is applicable to the VSELP system as well. FIG. 10 illustrates the principal parts of its embodiment. In this instance, the random excitation source codebook 43 in FIG. 5 is formed by a number of basic vector codebooks $\mathbf{43}_1$ to $\mathbf{43}_n$ in each of which there is stored one random excitation vector. The random excitation vectors read out of the basic vector codebooks $\mathbf{43}_1$ and $\mathbf{43}_n$ are polarized or negative in polarity control parts $\mathbf{56}_1$ to $\mathbf{56}_n$ and the polarity-controlled random excitation vectors are multiplied by weighting coefficient vectors $w_{R1}$ to $w_{Rn}$ by weighting coefficient multipliers $\mathbf{57}_1$ to $\mathbf{57}_n$. The multiplied outputs are added together by an adder 58 and the added output is provided as the random excitation vector to the multiplier 46 in FIG. 5. The polarity control parts $\mathbf{56}_1$ to $\mathbf{56}_n$ are individually controlled by the control part 6 in FIG. 5 so that the distortion of the synthesized speech signal from the input speech signal is minimized. In other words, each pair of basic vector codebook $\mathbf{43}_i$ (where i=1,2, . . . , n) and polarity control part $\mathbf{56}_i$ constitutes one random excitation source codebook and one of two positive and negative random excitation vectors is selected by the control part 6. The weighting coefficient vectors $w_{R1}$ to $w_{Rn}$ of the weighting coefficient multipliers $\mathbf{57}_1$ a to $\mathbf{57}_n$ are set to bear the same relationship as that between the weighting coefficient vectors referred to previously with respect to FIG. 2A.

As will be understood from the description given above with reference to FIG. 10, the random excitation source codebook 43 in FIG. 5 may also be substituted with the basic vector codebooks $\mathbf{43}_1$ to $\mathbf{43}_n$ and the polarity control parts $\mathbf{56}_1$ tou $\mathbf{56}_n$ in FIG. 10. The same goes for the codebooks 43a and 43b in FIG. 8. The pitch excitation source codebook 39 in FIG. 5 may also be formed by what is called an adaptive codebook which adaptively generates the pitch excitation vector from the pitch period obtained by analyzing the input speech signal and the excitation signal vector E of the previous frame. This adaptive codebook can be used as the pitch excitation source codebook 39 when the configuration of FIG. 8 or 10 is employed as a substitute for the random excitation source codebook 43. Furthermore, the present invention is also applicable to an arbitrary combination of the vector coding of the power of a speech signal, the vector coding of a spectrum envelope parameter, the vector coding of a pitch excitation source codebook and the vector coding of a random excitation source codebook.

As described previously, the multipliers 21 and 22 in FIG. 2A may be omitted by prestoring, as the representative vectors, weighted representative vectors $W_1z_{1i}$ and $w_2z_{2j}$ obtained by multiplying the representative vectors in the codebooks CB1 and CB2 by the weighting coefficient vectors $w_1$ and $w_2$. Similarly, the multipliers 24 and 25 in FIG. 2B may be omitted by prestoring the weighted representative vectors $w_1z_{1i}$ and $w_2z_{2j}$ in the codebooks CB3 and CB4, respectively. Also in the FIG. 5 embodiment, the multipliers 21 and 22 may be omitted by prestoring weighted gain vectors in the gain codebooks CB1 and CB2. In FIGS. 8 and 9, too, the multipliers 51a, 51b and 53a and 53b may be omitted by prestoring weighted vectors in the codebooks 43a, 43b and 39a, 39b. While in the above representative vectors read out of two codebooks are vector-combined, the present invention is also applicable to a system wherein representative vectors read out of three or more codebooks are vector-combined. Moreover, the FIG. 5 embodiment of the present invention has been described as being applied to the coding of the input speech signal, but the invention is applicable to the encoding of ordinary acoustic signals as well as to the encoding of the speech signal.

Next, a description will be given of characteristics that are obtained in the cases of applying conventional techniques and the present invention to the vector coding of the gains $g_p$ and $g_c$ in the CELP speech coding shown in FIG. 5.

(A) A first conventional technique substitutes the two gain codebooks CB1 and CB2 in FIG. 5 with one gain codebook which specifies one two-dimensional gain vector by sevenbit label and has $2^7$=128 labels. The one component of the two-dimensional vector read out of the gain codebook is used as the gain $g_p$ for the pitch excitation vector and the other element as the gain $g_c$ for the random excitation vector.

(B) A second conventional technique uses the two gain codebooks CB1 and CB2 shown in FIG. 5 but does not use the weighting coefficient vectors. The codebook CB1 pre-stores therein $2^3$ two-dimensional vectors each of which is specified by a three-bit label, and the codebook CB2 pre-stores therein $2^4$ two-dimensional vectors each of which is specified by a four-bit label. The vectors selected from the two codebooks, respectively, are combined into one two-dimensional combined vector; the one element of the combined vector is used as the gain $g_p$ and the other element as the gain $g_c$.

(C) In the example of the present invention applied to the encoding of gain vectors in FIG. 5, the gain vectors read out of the gain codebooks CB1 and CB2 in the above-mentioned case (B) are multiplied by the weighting coefficient vectors $w_1$=(1.8, 0.2) and $w_2$=(0.2, 1.8) and then added together into a combined vector. The gain codebooks CB1' and CB2', which store weighted gain vectors obtained by multiplying the gain vectors read out of the two codebooks CB1 and CB2 by the weighting coefficient vectors $w_1$ and $w_2$, respectively, are the same as those in FIGS. 6A and 6B.

Figure 11:
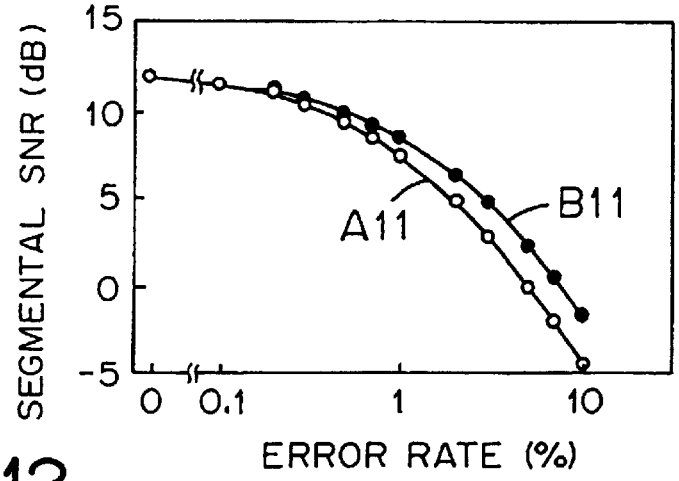
FIG. 11 is a graph showing segmental SN ratio of reconstructed speech with respect to a channel error rate in the cases of using one gain codebook and two gain codebooks for vector encoding of gains $g_p$ and $g_c$ in FIG. 5.

In FIG. 11 there are indicated, by the curves A11 and B11, measured results of the segmental SN ratio of reconstructed speech to the error rate when a channel error occurred in the gain labels in the encoded outputs of speech by the configurations of Cases (A) and (B) in FIG. 5. The segmental SN ratio is obtained by measuring the SN ratio of each frame for several minutes and averaging the measured values. The use of two codebooks (curve B11) attains a more excellent segmental SN ratio to the channel error than in the case of using one codebook (curve A11).

Figure 12:
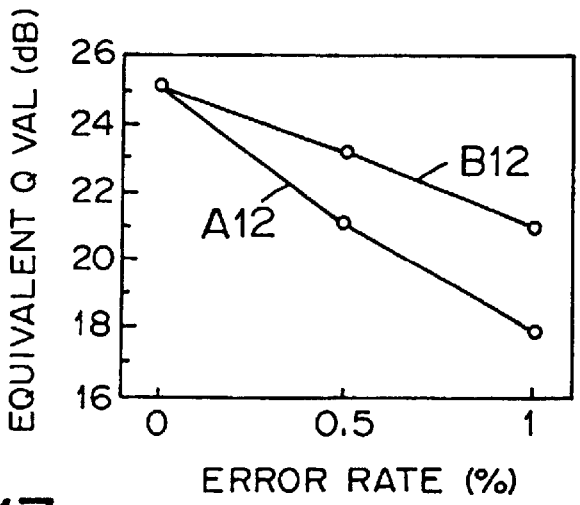
FIG. 12 is a graph showing, as an equivalent Q value, the MOS of the reconstructed speech with respect to the channel error rate in the two cases of FIG. 11.

In FIG. 12 there are shown, by curves A12 and B12, equivalent Q values converted from mean opinion scores of 24 ordinary people about the reconstructed speech with respect to the channel error rate of the gain labels in the case of FIG. 11. As is evident from FIG. 12, the use of two codebooks is preferable from the viewpoint of the channel error rate, and even if the two cases shown in FIG. 11 do not greatly differ in their SN ratio characteristic, they greatly differ psycho-acoustically.

Figure 13:
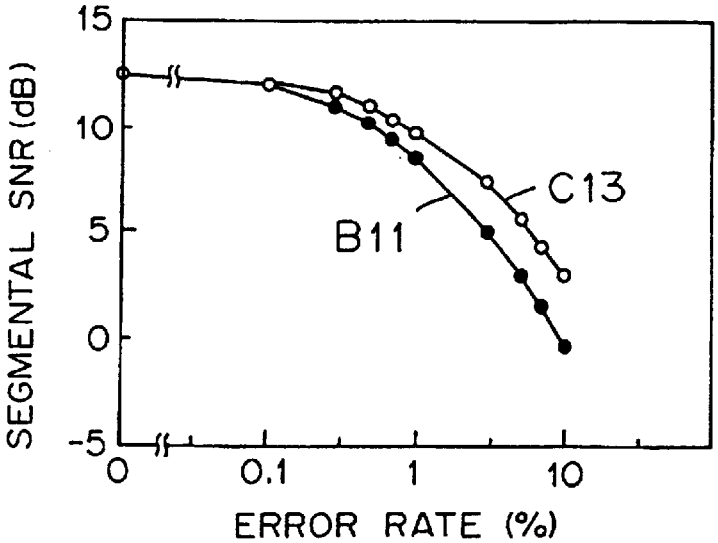
FIG. 13 is a graph showing the segmental SN ratio of reconstructed speech with respect to the channel-error rate in the case of the present invention that uses two weighted gain codebooks for vector encoding of the gains $g_p$ and $g_c$ in FIG. 5.

FIG. 13 shows, by the curve C13, measured values of the segmental SN ratio of reconstructed speech to the channel error rate in the Case (C) as in the case of FIG. 11, the curve B11 in the Case (B) being shown for comparison use. Apparently, the SN ratio of the reconstructed speech to the channel error rate in the case of the present invention is better than in the prior art. In view of the fact that the difference between the SN ratios shown in FIGS. 11 and 12 exerts a great influence on the equivalent Q value, it is expected that the present invention, which uses two weighted codebooks, improves the equivalent Q value more than in the case of using two unweighted codebooks.

As described above, according to the present invention, in the case of encoding vectors through the use of a plurality (M) of codebooks each having L-dimensional vectors, L-dimensional weighting coefficient vectors $w_1, \ldots, w_M$ for the codebooks are selected so that the sum of weighting coefficient matrixes $W_1, \ldots, W_M$, each having components of the weighting coefficient vectors as diagonal elements, becomes a constant multiple of the unit matrix. As the result of this, the vector distribution of each codebook is deviated or biased by the L weighting coefficient vectors in such a manner that the individual vectors approach different coordinate axes of the L-dimensional coordinate system (that is, compress component values of other dimensions). In the case where a signal is encoded by a pair of such weighted vectors for each codebook in a manner to minimize the distortion and the labels of the M codebooks corresponding to the weighting coefficient vectors are transmitted, if an error occurs, for example, in one of the labels during transmission over the channel, there is a possibility that an error in the coordinate-axis direction of one dimension is large, but since errors in the coordinate-axis direction of all the other dimensions are compressed, the error of the absolute value of the combined vector does not become so large. Hence, the application of the present invention to the encoding of speech signals is effective in suppressing abnormalities that result from channel errors.

Furthermore, according to the present invention, a plurality of weighted vectors of each codebook are pre-selected for input signal vectors and the distortion by encoding is calculated with respect to such pre-selected weighted vectors alone—this appreciably reduces the amount of calculations involved in the encoding and speeds up the encoding.

The present invention is also applicable to what is called a CELP or VSELP speech coding scheme, in which case the invention can be applied to the vector coding of spectrum envelope parameters, the vector coding of power and the vector coding of each codebook individually or simultaneously.

It will be apparent that many modifications and variations may be effected without departing from the scope of the novel concepts of the present invention.

What is claimed is:

1. A method of encoding an input vector through the use of M codebooks each having a plurality of labeled representative vectors of the same number of dimensions, said M being an integer equal to or greater than 2, said method comprising the steps of:

(a) selecting [said] *one* representative [vectors one by one] *vector* from *each of* said M codebooks;

(b) multiplying said representative vectors, each selected from one of said M codebooks, by M predetermined weighting coefficient vectors of the same number of dimensions as those of said representative vectors to generate M weighted representative vectors, said M weighting coefficient vectors having at least one maximum component in a different dimension and at least one of the components of each weighting coefficient vector being different from at least one of the other components of said weighting coefficient vector;

(c) adding all of said M weighted representative vectors to generate a combined representative vector;

(d) calculating the distance between said input vector and said combined representative vector;

(e) repeating steps (a), (b), (c) and (d) to search for and determine said combined representative vector which has the minimum distance between it and said input signal vector; and (f) encoding and outputting labels attached to said representative vectors of said codebooks which provided said combined representative vector of said minimum distance.

2. A method of encoding an input vector through the use of M codebooks each having a plurality of labeled representative vectors of the same number of dimensions, said M being an integer equal to or greater than 2, said method comprising the steps of:

(a) multiplying representative vectors, each selected from one of said M codebooks, by M weighting coefficient vectors of the same number of dimensions as those of said representative vectors of said M codebooks to obtain [an] M groups of weighted representative vectors, and determining M straight lines for approximating said M groups of weighted representative vectors, respectively, said M weighted coefficient vectors each having at least one maximum component in a different dimension;

(b) projecting said input vector on said M straight lines on an M-dimensional coordinate system and pre-selecting pluralities of weighted representative vectors adjacent or close to said projections, respectively, to form M subgroups;

(c) selecting weighted representative vectors from said M subgroups and adding them to obtain a combined representative vector;

(d) calculating the distance between said combined representative vector and said input vector;

(e) repeating said steps (c) and (d) for each combination of weighted representative vectors of said M subgroups to calculate said distance; and (f) determining labels in said M codebooks which correspond to said weighted representative vectors of the combination that was minimum in said distance, and outputting said labels as encoded results of said input signal vector.

3. A method of encoding an input vector through the use of M codebooks each having a plurality of labeled representative vectors of the same number of dimensions, said M being an integer equal to or greater than 2, said method comprising the steps of:

(a) pregenerating M weighted codebooks each having weighted representative vectors obtained by multiplying representative vectors of said M codebooks by M predetermined weighting coefficient vectors of the same number of dimensions as those of said representative vectors, said M weighting coefficient vectors each having at least one maximum component in a different dimension and at least one of the components of each weighting coefficient vector being different from at least one of the other components of said weighting coefficient vector;

(b) selecting *one* representative [vectors one by one] *vector* from *each of* said M weighted codebooks;

(c) adding all of said M weighted representative codebooks to generate a combined representative vector;

(d) calculating the distance between said input vector and said combined representative vector;

(e) repeating steps (b), (c) and (d) to search for and determine said combined representative vector which has the minimum distance between it and said input vector; and (f) encoding and outputting labels attached to representative vectors of said codebooks which provided said combined representative vectors of said minimum distance.

4. A method of encoding an input vector through the use of M codebooks each having a plurality of labeled representative vectors of the same number of dimensions, said M being an integer equal to or greater than 2, said method comprising the steps of:

(a) multiplying representative vectors of said M codebooks by M weighting coefficient vectors of the same number of dimensions as those of said representative vectors to obtain [an] M groups of weighted representative vectors, said M weighting coefficient vectors each having at least one maximum component in a different dimension;

(b) determining M straight lines for approximating said M groups of weighted representative vector, respectively;

(c) projecting said input vector on said M straight lines on an M-dimensional coordinate system and pre-selecting pluralities of weighted representative vectors adjacent or close to said projections, respectively, to form M subgroups;

(d) selecting weighted representative vectors from said M subgroups, respectively, and adding them to obtain a combined representative vector;

(e) calculating the distance between said combined representative vector and said input vector;

(f) repeating said steps (d) and (e) for each combination of weighted representative vectors of said M subgroups to calculate said distance; and (g) determining labels in said M codebooks which correspond to said weighted representative vectors of the combination which was minimum in said distance, and outputting said labels as encoded results of said input vector.

5. The method of claim 1, 2, 3, or 4 wherein said M weighting coefficient vectors are selected so that the sum of M diagonal matrixes using components of said weighting coefficient vectors as their diagonal elements becomes a constant multiple of the unit matrix.

6. The method of claim 2 or 4 wherein said subgroup determining [steps] *step* includes a step of selecting a predetermined number of said weighted representative vectors closest to the position of projection of said input vector on each of said M straight lines.

7. The method of claim 2 or 4 wherein said [subgoup] *subgroup* determining step includes a step of selecting said weighted representative vectors lying within the range of a predetermined distance from the position of projection of said input vector on each of said M straight lines.

8. The method of claim 2 or 4 wherein: said representative vectors and said weighting coefficient vectors are each an M-dimensional vector; said M weighting coefficient vectors each have at least one maximum component in a different dimension to make said dimension an emphasized dimension, F threshold values are determined on the basis of the element values of said emphasized dimensions over the entire range defined by maximum and minimum components of said emphasized dimensions of all of said M weighted representative vector corresponding to said codebooks, by which component values of said emphasized dimensions of said M weighting coefficient vectors are split into F+1 regions, and a plurality of said weighted representative vectors are assigned to each of said regions, F being an integer equal to or greater than 1; and said subgroup determining step is a step of comparing values in said emphasized dimensions of said input vector projected on said M straight lines, respectively, with said threshold values to determine the regions to which said values in said emphasized dimensions belong, and selecting said weighted representative vectors belonging to said determined regions to form said subgroups.

9. A method of encoding the vector of an input acoustic signal through the use of M excitation source codebooks each having a plurality of labeled excitation vectors, said M being an integer equal to or greater than 2, said method comprising the steps of:

(a) calculating spectrum envelope parameters of said vector of said input acoustic signal, quantizing said spectrum envelope parameters and setting said quantized parameters as filter coefficients of a synthesis filter;

(b) selecting M excitation vectors from said M excitation source codebooks so that distortion of an acoustic signal synthesized by said synthesis filter, from said input acoustic signal, is minimized;

(c) selecting one gain vector from each of M gain codebooks each having a plurality of labeled M-dimensional gain vectors;

(d) multiplying said gain vectors selected from said M gain codebooks by M predetermined M-dimensional weighting coefficient vectors, respectively, to generate M weighted gain vectors, said M weighting coefficient vectors each having at least one maximum component in a different dimension and at least one of the components of each weighting coefficient vector being different from at least one of the other components of said weighting coefficient vector;

(e) adding all of said M weighted gain vectors to obtain a combined gain vector, and defining first to M-th components of said combined gain vector as first to M-th gains;

(f) providing said first to M-th gains to said M determined excitation vectors, respectively;

(g) adding said M gain-provided excitation vectors and exciting said synthesis filter by said added output to generate a synthesized acoustic signal;

(h) calculating distortion of said synthesized acoustic signal from said input acoustic signal;

(i) repeating steps (c) to (h) for every combination of respective gain vectors of said M gain codebooks to search for and determine M gain vectors that minimize said distortion, and obtaining M gain labels corresponding to said M gain vectors; and (j) outputting, as at least one part of encoded results of said input acoustic signal, said M gain labels obtained in said step (i) and the labels of said excitation codebooks obtained in said step (b).

10. A method of encoding the vector of an input acoustic signal through the use of M excitation source codebooks each having a plurality of labeled excitation vectors, said M being an integer equal to or greater than 2, said method comprising the steps of:

(a) calculating spectrum envelope parameters of said vector of said input acoustic signal, quantizing said spectrum envelope parameters and setting said quantized parameters as filter coefficients of a synthesis filter;

(b) selecting M excitation vectors from said M excitation source codebooks, respectively, so that distortion of synthesized speech by said synthesis filter, from said input acoustic signal, is minimized;

(c) providing first to M-th gains to said M determined excitation vectors, respectively, adding them to generate an excitation signal vector for excitation of said synthesis filter to generate said synthesized acoustic signal and, for each combination of said excitation vectors, searching for optimum values of said first to M-th gains which minimize said distortion of said synthesized acoustic signal from said input acoustic signal;

(d) multiplying respective gain vectors of M gain codebooks each having a plurality of labeled M-dimensional gain vectors by M predetermined M-dimensional weighting coefficient vectors for said M gain codebooks to obtain M groups of weighted gain vectors, and determining M straight lines for approximating said M groups of weighted gain vectors, said M weighting coefficient vectors each having at least one maximum component in a different dimension;

(e) projecting a vector, composed of said optimum first to M-th gains, on said M straight lines of an M-dimensional coordinate system, and pre-selecting from said M groups pluralities of weighted gain vectors adjacent or close to said projections to form M subgroup;

(f) selecting [said] *one* weighted representative [vectors one by one] *vector* from *each of* said M subgroups, adding them to obtain an M-dimensional combined gain vector, and defining first to M-th gain components of said combined gain vector as first to M-th gains;

(g) multiplying said M excitation vectors, determined in step (b), by said first to M-th gain components of said combined gain vector, respectively, and adding them to generate an excitation signal vector;

(h) applying said excitation signal vector, generated in said step (g), to said synthesis filter to synthesize an acoustic signal and calculating distortion of said acoustic signal from said input acoustic signal;

(i) repeating said steps (f), (g) and (h) for every combination of weighted representative vectors of said M subgroups to calculate said distortion, and determining gain labels in said M codebooks which correspond to said combination of weighted gain vectors which was minimum in said distortion; and (j) outputting labels of said M excitation vectors and said gain labels as at least one part of encoded results of said vector of said input acoustic vector.

11. A method of encoding the vector of an input acoustic signal through the use of M excitation source codebooks each having a plurality of labeled excitation vectors, said M being an integer equal to or greater than 2, said method comprising the steps of:

(a) calculating spectrum envelope parameters of said vector of said input acoustic signal, quantizing said spectrum envelope parameters and setting said quantized parameters as filter coefficients of a synthesis filter;

(b) selecting said excitation vectors one by one from said M excitation source codebooks so that distortion of a synthesized acoustic signal by said synthesis filter, from said input acoustic signal, is minimized;

(c) pregenerating M weighted gain codebooks each having M groups of labeled weighted gain vectors obtained by multiplying M-dimensional gain vectors of M gain codebooks by M predetermined M-dimensional weighting coefficient vectors, respectively, said M weighting coefficient vectors each having at least one maximum component in a different dimension and at least one of the components of each weighting coefficient vector being different from at least one of the other components of said weighting coefficient vector;

(d) selecting *one* representative weighted gain [vectors one by one] *vector* from *each of* said M weighted codebooks;

(e) adding all of said M weighted gain vectors to generate a combined gain vector, and defining first to M-th components of said combined gain vector as first to M-th gains;

(f) providing said first to M-th gains to said M excitation vectors respectively;

(g) adding said M gain-provided excitation vectors, and exciting said synthesis filter by said added output to generate a synthesized acoustic signal;

(h) calculating distortion of said synthesized acoustic signal from said input acoustic signal;

(i) repeating said steps (d) to (h) for every combination of said weighted gain vectors of said M weighted codebooks to search for and determine M weighted gain vectors which minimize said distortion, and obtaining M labels corresponding to said M weighted gain vectors; and (j) outputting, as at least one part of encoded results of said input acoustic signal, said M labels of said M weighted gain codebooks obtained in said step (i) and labels of said M excitation codebooks obtained in said step (b).

12. A method of encoding the vector of an input acoustic signal through the use of M excitation source codebooks each having a plurality of labeled excitation vectors, said M being an integer equal to or greater than 2, said method comprising the steps of:

(a) calculating, spectrum envelope parameters of said vector of said input acoustic signal, quantizing said spectrum envelope parameters and setting said quantized parameters as filter coefficients of a synthesis filter;

(b) selecting said excitation vectors one by one from said M excitation source codebooks so that distortion of a synthesized acoustic signal by said synthesis filter, from said input acoustic signal, is minimized;

(c) providing first to M-th gains to said selected M excitation vectors, adding them to generate an excitation signal vector, and searching for and determining optimum values of said first to M-th gains such that distortion of a synthesized acoustic signal from said synthesis filter excited by said excitation signal vector, from said input acoustic signal, is minimized;

(d) pregenerating M weighted codebooks each having M groups of labeled gain vectors obtained by multiplying M-dimensional gain vectors of M gain codebooks by M predetermined M-dimensional weighting coefficient vectors, respectively, said M weighting coefficient vectors each having at least one maximum component in a different dimension, and determining M straight lines for approximating said M groups of weighted gain vectors, respectively;

(e) projecting a vector, composed of said optimum first to M-th gains, said M straight lines on an M-dimensional coordinate system, and pre-selecting from said M groups pluralities of weighted gain vectors adjacent or close to said projections to form M subgroups;

(f) selecting [said] *one* weighted gain [vectors one by one] *vector* from *each of* said M subgroups, adding them to obtain an M-dimensional combined gain vector, and defining first to M-th gain components of said combined gain vector as first to M-th gains, (g) multiplying said M excitation vectors, determined in said step (b), by said first to M-th gain components of said combined gain vector, and adding them to generate an excitation signal vector;

(h) applying said excitation signal vector to said synthesis filter to synthesize an acoustic signal, and calculating its distortion from said input acoustic signal;

(i) repeating said steps (f), (g) and (h) for every combination of weighted representative vectors of said M subgroups to calculate said distortion, and searching for and determining gain labels in said M codebooks which correspond to weighted gain vectors of the combination which was minimum in said distortion; and (j) outputting labels of said M determined excitation vectors and said determined gain labels as at least one part of encoded results of said vector of said input acoustic signal vector.

13. The method of claim 9, 10, 11, or 12 wherein said M weighting coefficient vectors are selected so that the sum of M diagonal matrixes using components of said M weighting coefficient vectors as diagonal elements becomes a constant multiple of the unit matrix.

14. The method of claim 10 or 12 wherein said subgroup determining step includes a step of selecting a predetermined number of said weighted gain vectors closest to the position of projection of a vector, composed of said first to M-th gains, on said M straight lines, respectively.

15. The method of claim 10 or 12 wherein said subgroup determining step includes a step of selecting said weighted gain vectors lying within the range of a predetermined distance from the position of projection of a vector, composed of said first to M-th gains, on said M straight lines, respectively.

16. The method of claim 10 or 12 wherein: letting said dimension corresponding to the maximum component of said each weighting coefficient vector be defined as an emphasized dimension, F threshold values are predetermined over the entire range defined by maximum and minimum values of said components in said emphasized dimension of all of said weighted gain vectors corresponding to each of said gain codebooks, on the basis of the component values in said emphasized dimensions, by which the component values in said emphasized dimensions of said weighted gain vectors are split into F+1 regions, and a plurality of said weighted gain vectors are assigned to each of said regions, said F being an integer equal to or greater than 1; and said subgroup determining step is a step of comparing values in said emphasized dimensions of a vector composed of said optimum first to M-th gains and projected on said M straight lines, respectively, with said threshold values to determine the regions to which said component values in said emphasized dimensions belong, and selecting said weighted gain vectors belonging to said determined region to form said subgroups.

17. An encoder for encoding the vector of an input signal through the use of a plurality of codebooks, comprising:

M codebook each having a plurality of labeled representative vectors;

multiplying means for multiplying representative vectors selected from said M codebooks by M predetermined but different weighting coefficient vectors to generate weighted representative vectors, and an M being an integer equal to or greater than 2 and said M weighting coefficient vectors each having at least one maximum component in a different dimension and at least one of the components of each weighting coefficient vector being different from at least one of the other components of said weighting coefficient vector;

a vector combining part for adding said M weighted vectors to generate a combined representative vector;

a distance calculating part for calculating the distance between said combined representative vector from said vector combining part and said input vector; and a control part for operating said vector combining part and said distance calculating part while changing the selection of weighted representative vectors from said M weighted codebooks, for determining a combination of weighted representative vectors of said M codebooks which minimizes said distance, and for outputting their corresponding labels as encoded results of the vector of said input signal.

18. An encoder for encoding the vector of an input signal through the use of a plurality of codebooks, comprising:

M weighted representative codebooks each having M groups of weighted representative vectors generated by multiplying representative vectors of M groups by M different weighting coefficient vectors, respectively, said M being an integer equal to or greater than 2 and said weighting coefficient vectors each having at least one maximum component in a different dimension and at least one of the components of each weighting coefficient vector being different from at least one of the other components of said weighting coefficient vector;

a vector combining part for adding M weighted vectors respectively selected from said M weighted codebooks to generate a combined representative vector;

a distance calculating part for calculating the distance between said combined representative vector from said vector combining part and the vector of said input signal; and a control part for operating said vector combining part and said distance calculating part while changing the selection of weighted representative vectors from said M weighted codebooks, for determining a combination of weighted representative vectors of said M weighted codebooks which minimizes said distance, and for outputting their corresponding labels as encoded results of the vector of said input signal.

19. The encoder of claim 17 or 18 wherein said M weighting coefficient vectors are determined so that the sum of M diagonal matrixes using, as their diagonal elements, components of said M weighting coefficient vectors becomes a constant multiple of the unit matrix.

20. The encoder of claim 17 or 18 wherein said control part includes means which determines M straight lines closest to said M groups of weighted representative vectors, respectively, pre-selects from said M weighted representative codebooks, as subgroups, pluralities of weighted representative vectors adjacent or close to the points of projection of the vector of said input signal on said M straight lines, controls said distance calculating part to calculate said distance for every combination of M weighted representative vectors selected from said M subgroups, and determines the combination of weighted representative vectors which minimizes said distance.

21. An encoder for encoding the vector of an input acoustic signal through the use of a plurality of codebooks, comprising:

M excitation source codebooks each having a plurality of excitation vectors, said M being an integer equal to or greater than 2;

first to M-th gain providing parts for multiplying said M excitation vectors from said M excitation source codebooks by first to M-th gains, respectively;

an adding part for adding said M gain-provided excitation vectors from said first to M-th gain providing parts to generate an excitation signal vector;

filter coefficient generating means which analyzes said input acoustic signal to obtain parameters representing its spectrum envelope and quantizes said parameters to generate filter coefficients;

a synthesis filter which has said filter coefficients set therein and is excited by said excitation signal vector to synthesize an acoustic signal;

distortion calculating means for calculating the difference between said input acoustic signal and said synthesized acoustic signal and for calculating from said difference the distortion of said synthesized acoustic signal from said input acoustic signal;

M gain codebooks each having a plurality of labeled M-dimensional gain vectors;

multiplying means for multiplying gain vectors respectively selected from said M gain codebooks by M predetermined M-dimensional weighting coefficient vectors to generate weighted gain vectors, said M weighting coefficient vectors each having at least one maximum component in a different dimension and at least one of the components of each weighting coefficient vector being different from at least one of the other components of said weighting coefficient vector;

a vector combining part for adding said M weighted gain vectors to generate an M-dimensional combined gain vector and for setting first to M-th components of said combined gain vector as first to M-th gains in said first to M-th gain providing parts, respectively; and control means for controlling the selection of said M excitation vectors from said M excitation source codebooks, for determining a combination of said M excitation vectors which minimizes said distortion of said synthesized acoustic signal from said input acoustic signal, for calculating said distortion by calculating means for every combination of gain vectors respectively selected from said M gain codebooks to determine a combination of M gain vectors which minimizes said distortion, and for outputting labels of said M gain codebooks corresponding to said M determined gain vectors and labels corresponding to said M determined excitation vectors as at least one part of encoded results of said input acoustic signal.

22. An encoder for encoding the vector of an input acoustic signal through the use of a plurality of codebooks, comprising:

M excitation source codebooks each having a plurality of excitation vectors, said M being an integer equal to or greater than 2;

first to M-th gain providing parts for multiplying said M excitation vectors from said M excitation source codebooks, respectively;

an adding part for adding said M gain-provided excitation vectors from said first to M-th gain providing parts to generate an excitation signal vector;

filter coefficient generating means which analyzes said input acoustic signal to obtain parameters representing its spectrum envelope and quantizes said parameters to generate filter coefficients;

a synthesis filter which has said filter coefficients set therein and is excited by said excitation signal vector to synthesize an acoustic signal;

distortion calculating means which calculates the difference between said input acoustic signal and said synthesized acoustic signal and calculates from said difference the distortion of said synthesized acoustic signal from said input acoustic signal;

M weighted gain codebooks each having M groups of weighted gain vectors generated by multiplying M groups of M-dimensional gain vectors by M-dimensional weighting coefficient vectors, said M weighting coefficient vectors having at least one maximum component in a different dimension and at least one of the components of each weighting coefficient vector being different from at least one of the other components of said weighting coefficient vector;

a vector combining part which adds M weighted vectors respectively selected from said M weighted codebooks to generate a combined representative vector and sets first to M-th components of said combined gain vector as first to M-th gains in said first to M-th gain providing parts, respectively; and control means which controls the selection of said M excitation vectors from said M excitation source codebooks, determines a combination of said M excitation vectors which minimizes said distortion of said synthesized acoustic signal from said input acoustic signal, obtains by calculating means said distortion for each combination of weighted gain vectors selected from said M weighted gain codebooks, determines a combination of M weighted gain vectors which minimizes said distortion, and outputs labels of said M weighted gain codebooks corresponding to said M determined weighted gain vectors and labels corresponding to said M determined excitation vectors as at least one part of encoded results of said input acoustic signal.

23. The encoder of claim 21 or 22 wherein said M weighting coefficient vectors are selected so that the sum of M diagonal matrixes using the components of said M weighting coefficient vectors as their diagonal elements becomes a constant multiple of the unit matrix.

24. The encoder of claim 21 or 22 wherein said control means includes means which: determines M straight lines closest to weighted gain vectors of said M groups, respectively; when said M excitation vectors are being determined, controls said first to M-th gains to determine their optimum values which minimize said distortion; pre-selects, as subgroups, from weighted gain vectors of said M groups a plurality of weighted gain vectors adjacent or close to the points of projection of a vector, composed of said optimum first to M-th gains, on said M straight lines, respectively; and controls said distortion calculating means to calculate said distortion for each combination of M weighted gain vectors respectively selected from said M subgroups and determines a combination of weighted gain vectors which minimizes said distortion.

25. A decoder for decoding an inputted code by referring to a plurality of codebooks, comprising:

M codebook each having a plurality of labeled representative vectors, said M being an integer equal to or greater than 2;

multiplying means which selects representative vectors corresponding to respective labels in said input code from the corresponding ones of said codebooks and multiplies said selected representative vectors by M weighting coefficient vectors predetermined for said M codebooks to generate M weighted representative vectors; and a vector combining part which combines said M weighted representative vectors into a reconstructed vector;

wherein said M weighting coefficient vectors each has at least one maximum component in a different dimension and at least one of the components of each weighting coefficient vector is different from at least one of the other components of said weighting coefficient vector.

26. A decoder for decoding an inputted code by referring to a plurality of codebooks, comprising:

M weighted codebooks each having a plurality of labeled weighted representative vectors, said M being an integer equal to or greater than 2; and a vector combining part which selects from said M weighted codebooks weighted representative vectors corresponding to M labels in said input code and combines them into a reconstructed vector;

wherein said M weighting coefficient vectors each have at least one maximum component in a different dimension and at least one of the components of each weighting coefficient vector is different from at least one of the other components of said weighting coefficient vector.

27. The decoder of claim 25 or 26, wherein said M weighting coefficient vectors are selected so that the sum of M diagonal matrixes using components of said M weighting coefficient vectors as their diagonal elements become a constant multiple of the unit matrix.

*28. A method of encoding an input vector through the use of M codebooks, each including a plurality of representative vectors, each representative vector having a corresponding label, said M being an integer equal to or greater than 2, and the method comprising the steps of:*

*searching a combination of M representative vectors, each representative vector of the M representative vectors being selected from a different one of the M codebooks, for a combined minimum vector of the M selected representative vectors which provides a minimum distance between the input vector and itself; and*

*outputting the corresponding labels for the M selected representative vectors of the combined minimum vector, wherein the representative vectors of a respective codebook of the M codebooks have a distribution which is concentrated close to a respective dimensional axis of the representative vectors in the respective codebook, said respective dimensional axis being different for each of the M codebooks.*

*29. The method of claim 28, wherein the searching step comprises the steps of:*

*(a) selecting one representative vector from each of the M codebooks;*

*(b) adding all representative vectors selected in step (a) to generate a combined vector;*

*(c) calculating a distance between the input vector and the combined vector generated in step (b); and*

*(d) repeating steps (a), (b) and (c) to determine the combined minimum vector which provides the minimum distance between the input vector and itself.*

*30. A method of encoding an input vector through the use of M codebooks, each including a plurality of representative vectors, each representative vector having a corresponding label, said M being an integer equal to or greater than 2, and the method comprising the steps of:*

*projecting the input vector onto M straight lines, each straight line approximating a respective distribution of the representative vectors in a respective codebook of the M codebooks;*

*preselecting a predetermined number of representative vectors present around each projection of the input vector onto the M straight lines so as to form M sets of pre-selected representative vectors;*

*searching a combination of the preselected representative vectors, each preselected vector being selected from a different one of the M sets or preselected representative*

*vectors, for a combined minimum vector which provides a minimum distance between the input vector and itself; and*

*outputting the corresponding labels for the preselected representative vectors of the combined minimum vector, wherein the representative vectors of a respective codebook of the M codebooks have a distribution which is concentrated close to a respective dimensional axis of the representative vectors in the respective codebook, said respective dimensional axis being different for each of the M codebooks.*

*31. The method of claim 30, wherein the searching step comprises the steps of:*

*(a) selecting one representative vector from each of the M sets of preselected representative vectors;*

*(b) adding all representative vectors selected in step (a) to generate a combined vector;*

*(c) calculating a distance between the input vector and the combined vector generated in step (b); and*

*(d) repeating steps (a), (b) and (c) to determine the combined minimum vector which provides the minimum distance between the input vector and itself.*

*32. The method of claims 30 or 31, wherein the preselecting step selects the predetermined number of representative vectors in an increasing order of a difference between a dimensional value of the projected input vector at the respective dimensional axis and a dimensional value of a respective representative vector at the respective dimensional axis.*

*33. An encoder for encoding an input vector, comprising:*

*M codebooks, each including a plurality of representative vectors, each representative vector having a corresponding label, in which the representative vectors of a respective codebook of the M codebooks have a distribution which is concentrated close to a respective dimensional axis of the representative vectors in the respective codebook, said respective dimensional axis being different from each of the M codebooks, and said M being an integer equal to or greater than 2;*

*a determining mechanism configured to search a combination of M representative vectors, each representative vector of the M representative vectors being selected from a different one of the M codebooks, for a combined minimum vector of the M selected representative vectors which provides a minimum distance between the input vector and itself; and*

*a controlling mechanism configured to output the corresponding labels for the M selected representative vectors of the combined minimum vector.*

*34. The encoder of claim 33, wherein the determining mechanism comprises:*

*a selecting mechanism configured to select one representative vector from each of the M codebooks;*

*an adding mechanism configured to add all representative vectors selected by the selecting mechanism to generate a combined vector; and*

*a distance calculating mechanism configured to calculate a distance between the input vector and the combined vector generated by the adding mechanism,*

*wherein the processes performed by the selecting, adding and distance calculating mechanisms are repeated to determine the combined minimum vector which provides the minimum distance between the input vector and itself.*

*35. An encoder for encoding an input vector through the use of M codebooks, each including a plurality of representative vectors, each representative vector having a corresponding label, said M being an integer equal to or greater than 2, the encoder comprising:*

*a projecting mechanism configured to project the input vector onto M straight lines, each M straight line approximating a respective distribution of the representative vectors in a respective codebook of the M codebooks;*

*a preselecting mechanism configured to preselect a predetermined number of representative vectors present around each projection of the input vector onto the M straight lines so as to form M sets of preselected representative vectors;*

*a searching mechanism configured to search a combination of the preselected representative vectors, each preselected representative vector being selected from a different one of the M sets of preselected representative vectors, for a combined minimum vector which provides a minimum distance between the input vector and itself; and*

*a controlling mechanism configured to output the corresponding labels for the preselected representative vectors of the combined minimum vector,*

*wherein the representative vectors of a respective codebook of the M codebooks have a distribution which is concentrated close to a respective dimensional axis of the representative vectors in the respective codebook, said respective dimensional axis being different for each of the M codebooks.*

*36. The encoder of claim 35, wherein the searching mechanism comprises:*

*a selecting mechanism configured to select one representative vector from each of the M sets of preselected representative vectors;*

*an adding mechanism configured to add all representative vectors selected by the selecting mechanism to generate a combined vector; and*

*a calculating mechanism configured to calculate a distance between the input vector and the combined vector generated by the adding mechanism,*

*wherein the processes performed by the selecting, adding and calculating mechanisms are repeated to determine the combined minimum vector which provides the minimum distance between the input vector and itself.*

*37. The encoder of claims 35 or 36, wherein the preselecting mechanism selects the predetermined number of representative vectors in an increasing order of a difference between a dimensional value of the projected input vector at the respective dimensional axis and a dimensional value of a respective representative vector at the respective dimensional axis.*

*38. A method of decoding an input code through the use of M codebooks, each including a plurality of representative vectors, each representative vector having a corresponding label, said M being an integer equal to or greater than 2, and the method comprising the steps of:*

*selecting one representative vector from each of the M codebooks which correspond to labels in the input code; and*

*obtaining a reconstructed vector by combining the representative vectors selected in the selecting step,*

*wherein the representative vectors of a respective codebook of the M codebooks have a distribution which is concentrated close to a respective dimensional axis of the representative vectors in the respective*

*codebook, said respective dimensional axis being different for each of the M codebooks.*

*39. A decoder for decoding an input code comprising:*

*M codebooks each including a plurality of representative vectors, each representative vector having a corresponding label, in which the representative vectors of a respective codebook of the M codebooks have a distribution which is concentrated close to a respective dimensional axis of the representative vectors in the respective codebook, said respective dimensional axis being different for each of the M codebooks, and said M being an integer equal to or greater than 2;*

*a selecting mechanism configured to select one representative vector from each of the M codebooks which correspond to labels in the input code; and*

*a vector combining mechanism configured to reconstruct a vector by combining the representative vectors selected by the selecting mechanism.*

*40. A speech coding method, comprising the steps of:*

*calculating spectrum envelope parameters of an inputted speech signal;*

*quantizing the spectrum envelope parameters;*

*setting the quantized spectrum envelope parameters as filter coefficients of a synthesis filter;*

*selecting a pitch-excitation vector from a pitch-excitation source codebook which stores pitch-excitation vectors respectively containing different pitch-period components;*

*providing the selected pitch-excitation vector with a first gain;*

*selecting a random-excitation vector from a random-excitation source codebook;*

*providing the random-excitation vector with a second gain;*

*adding the pitch-excitation vector provided with the first gain and the random-excitation vector provided with the second gain; and*

*reproducing a synthesized speech signal by driving said synthesis filter having the filter coefficients with the added signal,*

*wherein a gain combined vector including M components is calculated by combining representative vectors each selected from a different codebook of the M codebooks, each codebook including a plurality of representative vectors, each representative vector having a corresponding label, in which the representative vectors of a respective codebook of the M codebooks have a distribution which is concentrated close to a respective dimensional axis of the representative vectors in the respective codebook, said respective dimensional axis being different for each of the M codebooks, and said M being an integer equal to or greater than 2,*

*wherein the first and second gains are respectively provided by using each component of the gain combined vector, and*

*wherein the gain combined vector is selected to minimize the distortion of the synthesized speech signal with respect to the inputted speech signal.*

*41. A speech encoder, comprising:*

*a calculating mechanism configured to calculate spectrum envelope parameters of an inputted speech signal;*

*a quantizing mechanism configured to quantize the spectrum envelope parameters;*

*a synthesis filter having filter coefficients set as the quantized spectrum envelope parameters;*

*a selecting mechanism configured to select a pitch-excitation vector from a pitch-excitation source codebook which stores pitch-excitation vectors containing different pitch-period components, the selected pitch-excitation vector being provided with a first gain;*

*a selecting mechanism configured to select a random-excitation vector from a random-excitation source codebook, the random-excitation vector being provided with a second gain; and*

*an adding mechanism configured to add the pitch-excitation vector provided with the first gain and the random-excitation vector provided with the second gain,*

*wherein a synthesized speech signal is reproduced by driving said synthesis filter with the added signal,*

*wherein a gain combined vector including M components is calculated by combining representative vectors each selected from a different codebook of M codebooks, each codebook including a plurality of representative vectors, each representative vector having a corresponding label, in which the representative vectors of a respective codebook of the M codebooks have a distribution which is concentrated close to a respective dimensional axis of the representative vectors in the respective codebook, said respective dimensional axis being different for each of the M codebooks, and said M being an integer equal to or greater than 2,*

*wherein the first and second gains are respectively provided by using each component of the gain combined vector, and*

*wherein the synthesized representative vector is selected to minimize the distortion of the synthesized speech signal with respect to the inputted speech signal.*

* * * * *